United States Patent
Yamada

(10) Patent No.: US 9,444,403 B2
(45) Date of Patent: Sep. 13, 2016

(54) RESONATION ELEMENT, RESONATOR, OSCILLATOR, ELECTRONIC DEVICE AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/836,354

(22) Filed: Aug. 26, 2015

(65) Prior Publication Data

US 2016/0072474 A1 Mar. 10, 2016

(30) Foreign Application Priority Data

Sep. 9, 2014 (JP) ................................ 2014-183733

(51) Int. Cl.
*H03B 5/30* (2006.01)
*H03H 9/10* (2006.01)
*H03H 9/24* (2006.01)
*H03H 9/02* (2006.01)

(52) U.S. Cl.
CPC .............. *H03B 5/30* (2013.01); *H03H 9/1057* (2013.01); *H03H 9/2473* (2013.01); *H03H 9/2484* (2013.01); *H03H 9/2494* (2013.01); *H03H 9/2431* (2013.01); *H03H 2009/02299* (2013.01); *H03H 2009/02503* (2013.01)

(58) Field of Classification Search
CPC .............................. H03H 9/215; H01L 41/09
USPC ....................... 331/116 R, 154, 158
See application file for complete search history.

(56) References Cited

U.S. PATENT DOCUMENTS

| 6,831,531 | B1 | 12/2004 | Giousouf et al. |
| 7,808,332 | B1 | 10/2010 | Pedersen et al. |
| 2009/0189481 | A1 | 7/2009 | Kaajakari |
| 2011/0068876 | A1* | 3/2011 | Yamada ............... H03H 9/1021 331/158 |
| 2011/0227672 | A1* | 9/2011 | Yamada ............... H03H 9/0547 333/200 |
| 2012/0235257 | A1 | 9/2012 | Yoshida |

FOREIGN PATENT DOCUMENTS

| GB | 1 408 619 A | 10/1975 |
| JP | 48-060557 A | 8/1973 |
| JP | 48-067725 A | 9/1973 |
| JP | 2004-515992 A | 5/2004 |

(Continued)

*Primary Examiner* — Jeffrey Shin
(74) *Attorney, Agent, or Firm* — Oliff PLC

(57) ABSTRACT

A resonation element includes a basal portion, resonating arms extending out in a Y-axis direction from the basal portion, and a vibration substrate, formed of single crystal silicon, in which a Z-axis direction is set to a thickness direction, and is configured such that the resonating arms are flexurally vibrated in an XY in-plane direction. In addition, when resonation frequencies of the resonating arms are set to F [kHz], widths of the resonating arms are set to W [μm], and lengths of the resonating arms are set to L [μm], at least one expression of the following Expression (1) and the following Expression (2) is satisfied.

$$W < 10^{A \times Log(F) + B} \quad (1)$$

where, A is $-5.006 \times 10^{-1}$, and B is 2.451, and $$L < 10^{C \times log(F) + D} \quad (2)$$

where, C is $-7.507 \times 10^{-1}$, and D is 4.268.

17 Claims, 21 Drawing Sheets

(56) References Cited

FOREIGN PATENT DOCUMENTS

| JP | 2007-175577 A | 7/2007 |
| JP | 2012-198036 A | 10/2012 |
| JP | 5662160 B2 | 1/2015 |
| WO | 02/51004 A1 | 6/2002 |
| WO | 2009092846 A1 | 7/2009 |

* cited by examiner

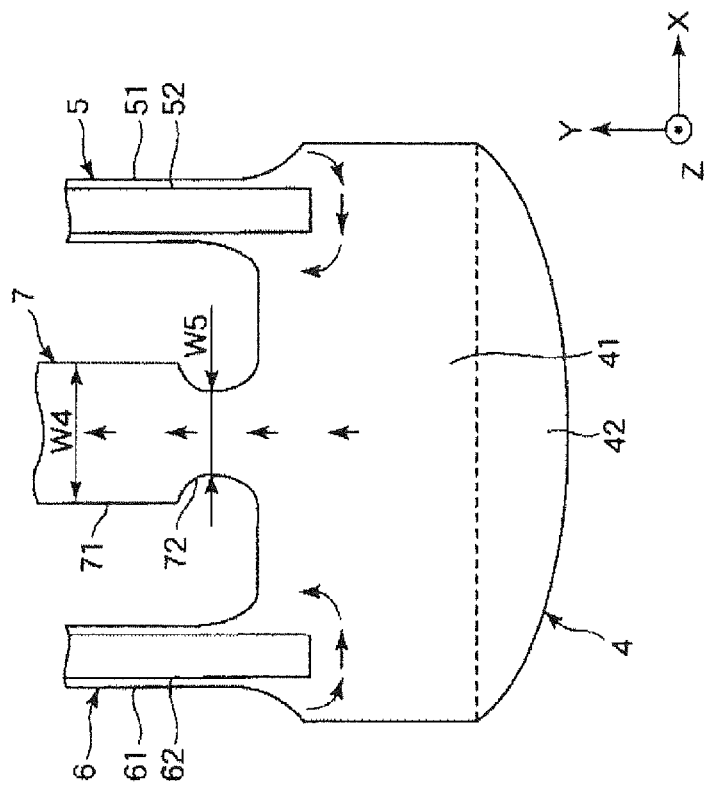
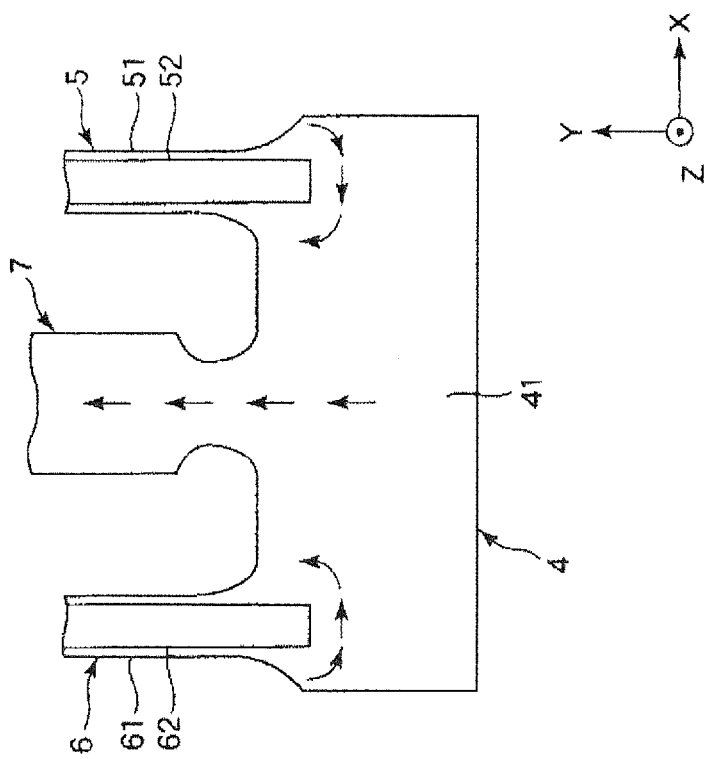
FIG. 4A
FIG. 4B

RESONATION ELEMENT, RESONATOR, OSCILLATOR, ELECTRONIC DEVICE AND MOVING OBJECT

BACKGROUND

1. Technical Field

The present invention relates to a resonation element, a resonator, an oscillator, an electronic device and a moving object.

2. Related Art

In small-sized information devices such as an HDD (hard disk drive), a mobile computer or an IC card, moving object communication devices such as a cellular phone, an automobile telephone or a paging system, and the like, electronic devices such as a resonator or an oscillator are widely used.

As resonation elements which are used in such electronic devices, an electrostatic drive type resonation element in which an electrostatic force is used in a drive unit (see, for example, JP-A-48-60557, JP-A-48-67725, and Specification of U.S. Pat. No. 7,808,332) and an electrostatic drive type resonation element in which a silicon substrate is used (see, for example, JP-T-2004-515992) have been hitherto known.

However, a resonation element which is formed of silicon has a problem in that there is a tendency to give rise to a decrease in Q value caused by heat conduction which is generally called a "thermo-elastic loss" In addition, since silicon is harder than a quartz crystal, a flexural resonation element formed of silicon is required to make the width thereof (length in the direction of a flexural vibration) smaller than that of a flexural vibration element formed of a quartz crystal when both are compared to each other with the same length. For this reason, a thermo-elastic loss increases, and thus it is difficult to obtain desired characteristics.

SUMMARY

An advantage of some aspects of the invention is to provide a resonation element, a resonator, an oscillator, an electronic device and a moving object which are capable of reducing a decrease in Q value and exhibiting excellent performance.

The invention can be implemented as the following forms or application examples.

Application Example 1

This application example is directed to a resonation element in which directions intersecting each other are set to a first direction, a second direction and a third direction, respectively, the resonation element including a basal portion, at least one resonating arm extending out in the first direction from the basal portion, and a single crystal silicon substrate in which a length along the second direction perpendicular to the first direction is set to a thickness. The resonating arm is flexurally vibrated along the third direction perpendicular to the first direction and the second direction. When a resonation frequency of the resonating arm is set to F [kHz], a width along the third direction the resonating arm is set to W [μm], and a length along the first direction of the resonating arm is set to L [μm], at least one expression of the following Expression (1) and the following Expression (2) is satisfied.

$$W < 10^{A \times Log(F) + B} \quad (1)$$

where, A is $-5.006 \times 10^{-1}$, and B is 2.451, and $$L < 10^{C \times \log(F) + D} \quad (2)$$

where, C is $-7.507 \times 10^{-1}$, and D is 4.268

With this configuration, since the width and length of the resonating arm is optimized and a thermo-elastic loss can be reduced, it is possible to increase a Q value, and to reduce an equivalent series resistance value in association therewith. Thus, it is possible to obtain a resonation element which is particularly excellent in a reduction in size and a reduction in power consumption.

Application Example 2

In the resonation element according to this application example, it is preferable that when Expression (1) is satisfied, the following Expression (3) is satisfied, and when Expression (2) is satisfied, the following Expression (4) is satisfied.

$$W < 0.8 \times 10^{A \times \log(F) + B} \quad (3)$$

$$L < 0.8 \times 10^{C \times \log(F) + D} \quad (4)$$

With this configuration, since a thermo-elastic loss is further reduced, it is possible to further increase a Q value, and to further reduce an equivalent series resistance value.

Application Example 3 and Application Example 4

In the resonation element according to these application examples, it is preferable that the resonating arm is flexurally vibrated by an electrostatic force.

With this configuration, it is possible to efficiently vibrate the resonating arm.

Application Example 5 and Application Example 6

In the resonation element according to these application examples, it is preferable that the resonating arm includes a region, receiving the electrostatic force, in a region from a tip on an opposite side to the basal portion side toward the basal portion side along the first direction to L/2, when seen in plan view.

The region from the tip of the resonating arm to L/2 is configured to receive the electrostatic force, and thus it is possible to more efficiently vibrate the resonating arm.

Application Example 7 and Application Example 8

In the resonation element according to these application examples, it is preferable that the resonating arm includes a pair of lateral sides having a front-back relationship with each other along the third direction, and that the silicon substrate is exposed in a region of ⅓ which is occupied by the pair of lateral sides in a total length of the resonating arm along the first direction from the basal portion side.

In the resonating arm that performs a flexural vibration, most of distortion is generated in a region of L/3 on the basal portion side. In addition, the distortion gradually increases toward the lateral side from the width center of the resonating arm (length center in the third direction). For this reason, when a material having a coefficient of thermal expansion different from that of the resonating arm is formed in this region, thermal stress is generated in the vicinity of the interface therebetween in association with a change in temperature. The relaxation phenomenon of this thermal stress causes a shift in a resonation frequency in the hysteresis or aging of a resonation frequency with respect to a change in temperature. From such a point, since distortion is large in the region of L/3 occupied in the total length of the resonating arm, particularly, a region of the lateral side, the resonating arm in this region is exposed, and thus it is possible to provide a resonation element having very high reliability.

Application Example 9 and Application Example 10

In the resonation element according to these application examples, it is preferable that the resonating arm includes front and back main surfaces in which the second direction is set to a normal direction, and is provided with a groove, extending in the first direction, on at least one of the main surface sides.

With this configuration, since a flow path of heat generated due to a flexural vibration can made longer, it is possible to further suppress a thermo-elastic loss in a region having a resonation frequency higher than a thermal relaxation frequency (described later), and to further increase a Q value.

Application Example 11 and Application Example 12

In the resonation element according to these application examples, it is preferable that the resonating arm includes a weight portion and an arm which is provided between the weight portion and the basal portion, when seen in plan view.

Since the width of the resonating arm can be made larger in order to offset resonation frequencies which are reduced by providing the weight portion, and the flow path of heat generated due to a flexural vibration can be made longer. Therefore, a thermo-elastic loss is further reduced in a region having a resonation frequency higher than a thermal relaxation frequency (described later), and thus it is possible to further increase a Q value, and to particularly reduce an equivalent series resistance value.

In addition, the length of the resonating arm can be shortened in order to offset resonation frequencies which are reduced by providing the weight portion, which leads to an effective reduction in the size of the resonation element.

Application Example 13 and Application Example 14

These application examples are directed to a resonator including the resonation element described above and a container that has the resonation element housed therein.

With this configuration, it is possible to obtain a resonator having reliability.

Application Example 15 and Application Example 16

These application examples are directed to an oscillator including the resonation element described above and a circuit.

With this configuration, it is possible to obtain an oscillator having reliability.

Application Example 17 and Application Example 18

These application examples are directed to an electronic device including the resonation element described above.

With this configuration, it is possible to obtain an electronic device having reliability.

Application Example 19 and Application Example 20

These application examples are directed to a moving object including the resonation element described above.

With this configuration, it is possible to obtain a moving object having reliability.

BRIEF DESCRIPTION OF THE DRAWINGS

The invention will be described with reference to the accompanying drawings, wherein like numbers reference like elements.

FIGS. 4A and 4B are plan views illustrating a function of a resonation element shown in FIG. 1.

FIG. 16A is a top view, and FIGS. 16B and C are schematic diagrams illustrating a flexural vibration of a resonation element shown in FIG. 16A.

FIG. 17A is a top view, and FIG. 17B is a schematic diagram illustrating a flexural vibration of a resonation element shown in FIG. 17A.

DESCRIPTION OF EXEMPLARY EMBODIMENTS

Hereinafter, a resonation element, a resonator, an oscillator, an electronic device and a moving object of the invention will be described in detail on the basis of preferred embodiments shown in the accompanying drawings.

1. Resonator

First, a resonator according to the invention will be described.

First Embodiment

Figure 1:
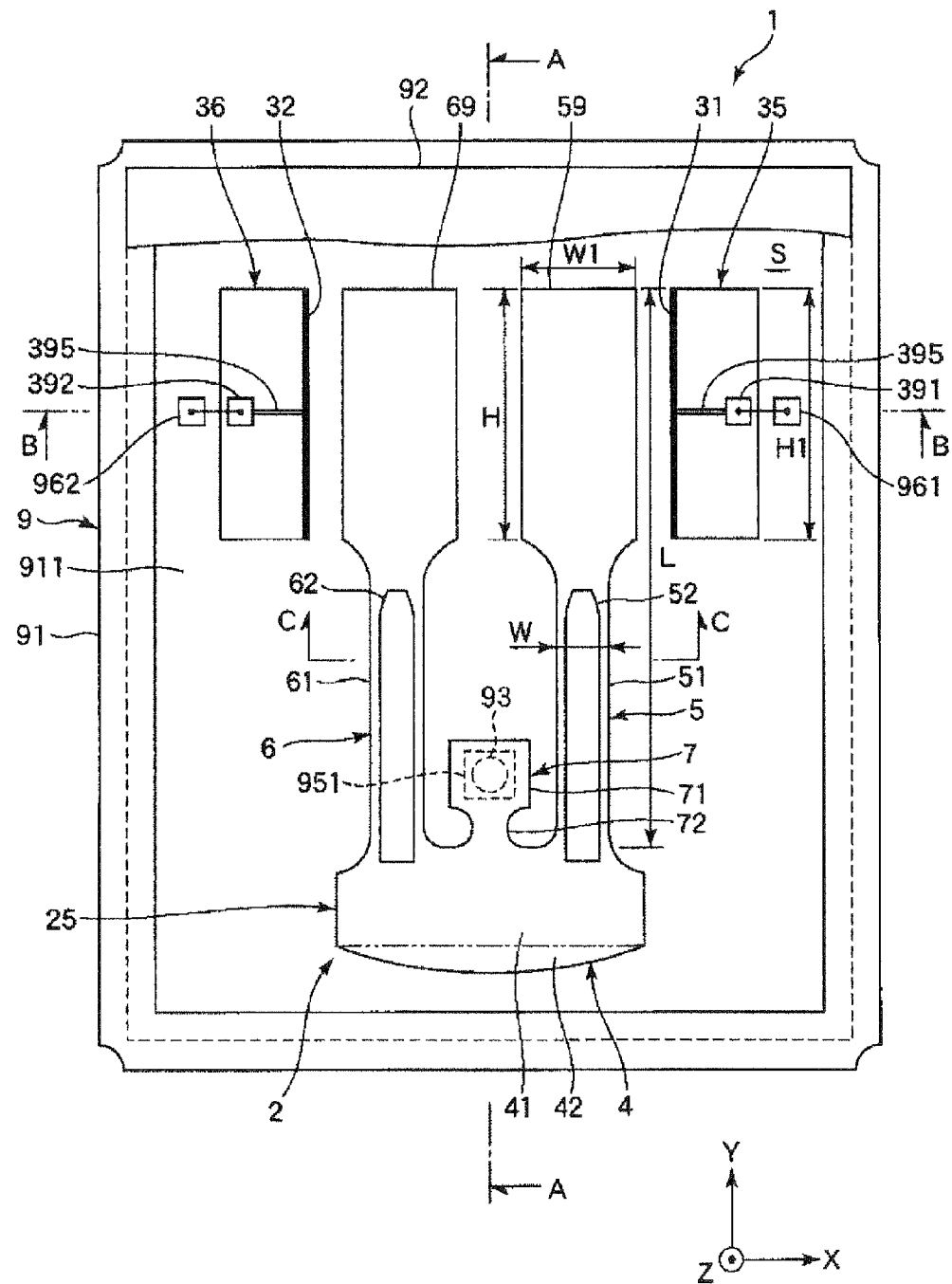
FIG. 1 is a plan view of a resonator according to a first embodiment of the invention.
Figure 2:
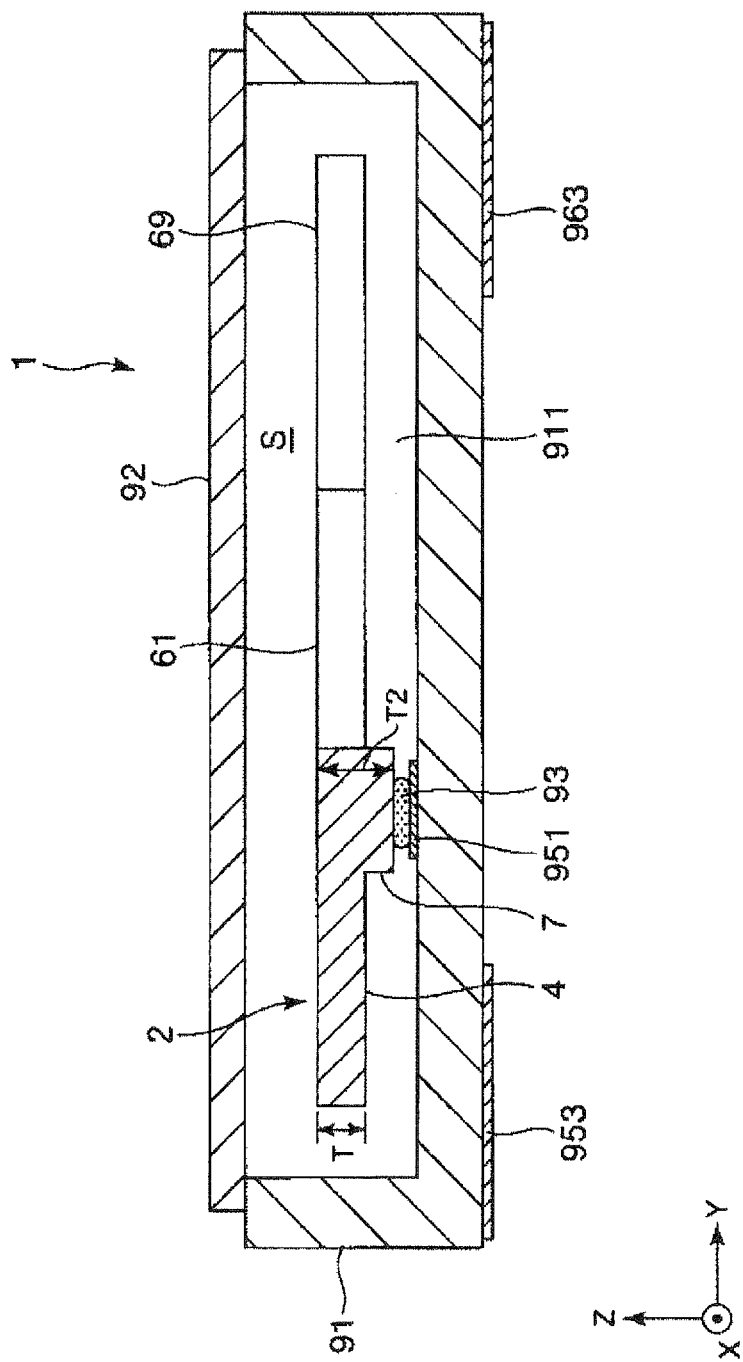
FIG. 2 is a cross-sectional view taken along line A-A of FIG. 1.
Figure 3:
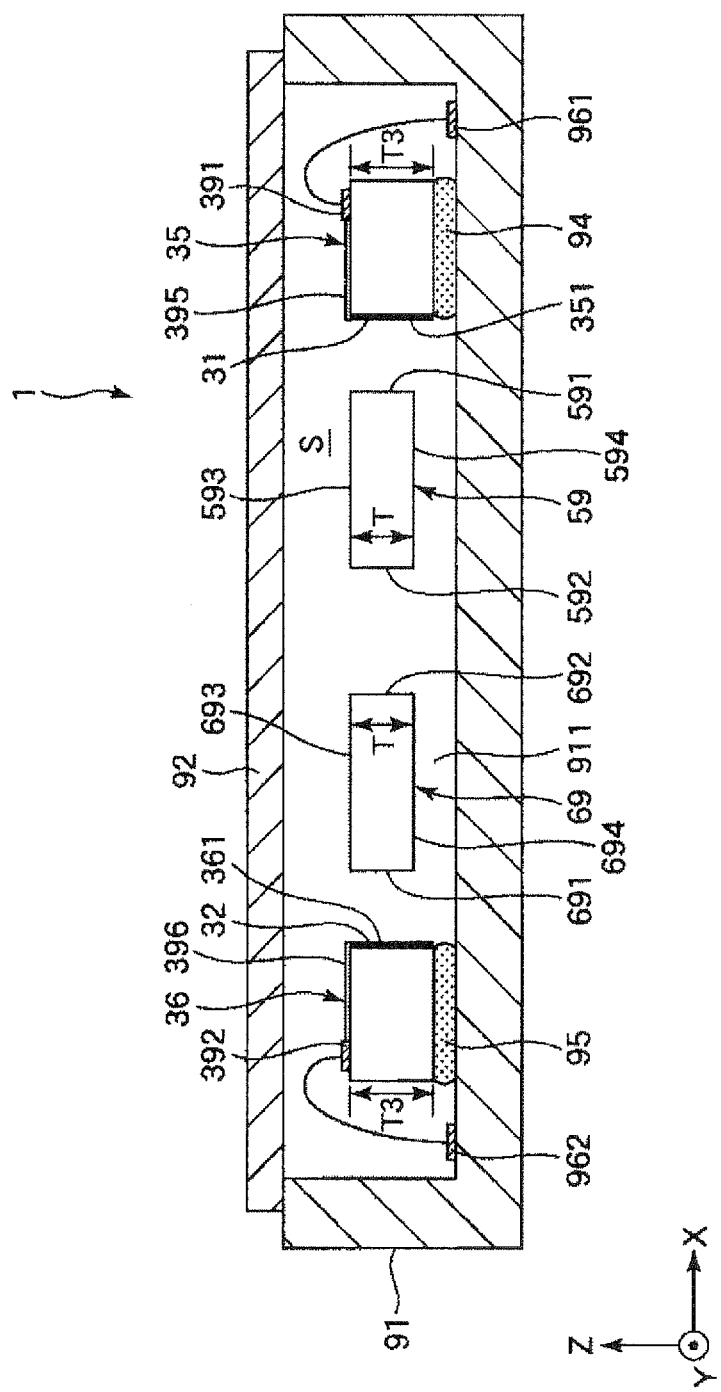
FIG. 3 is a cross-sectional view taken along line B-B of FIG. 1.
Figure 5:
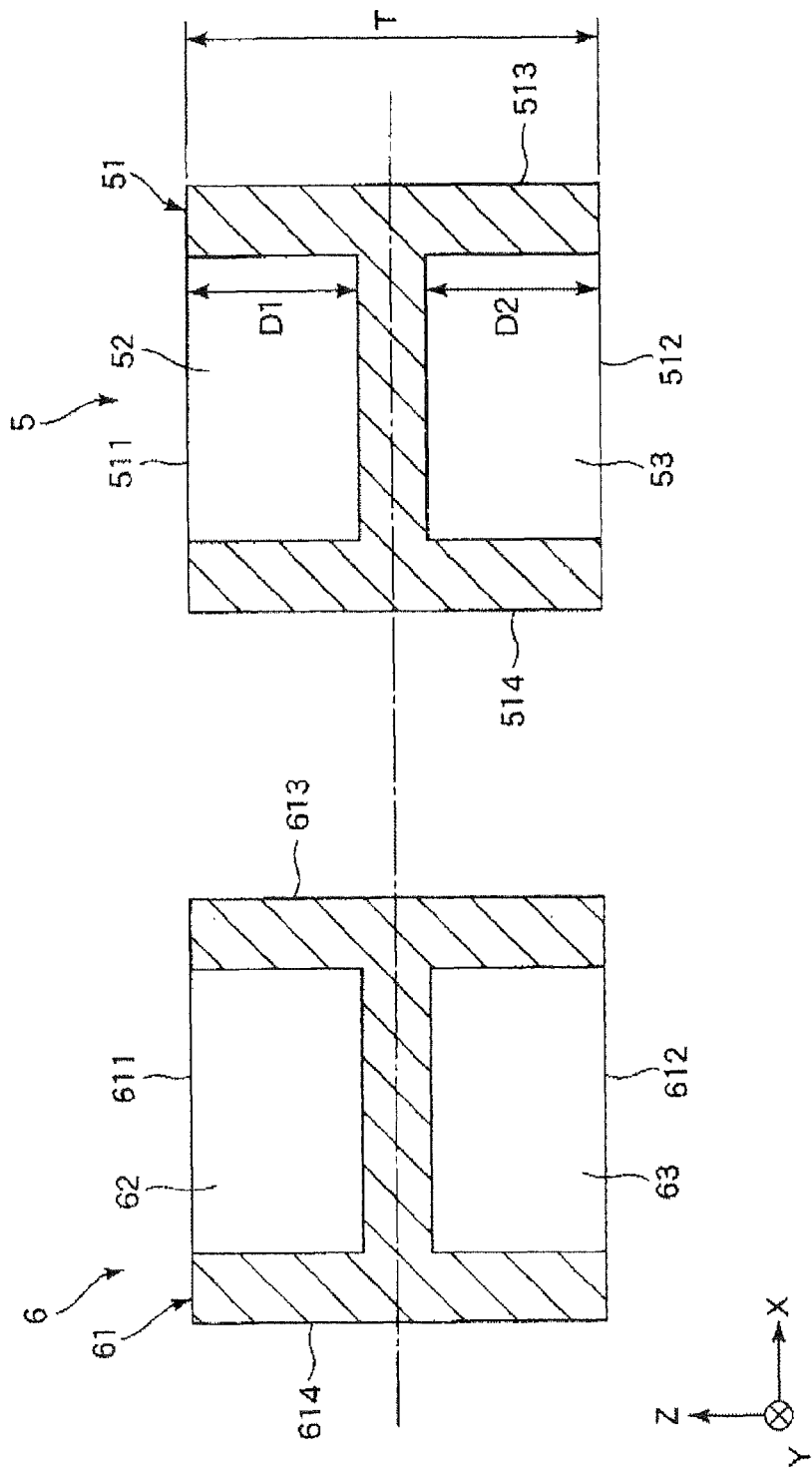
FIG. 5 is a cross-sectional view taken along line C-C of FIG. 1.
Figure 6:
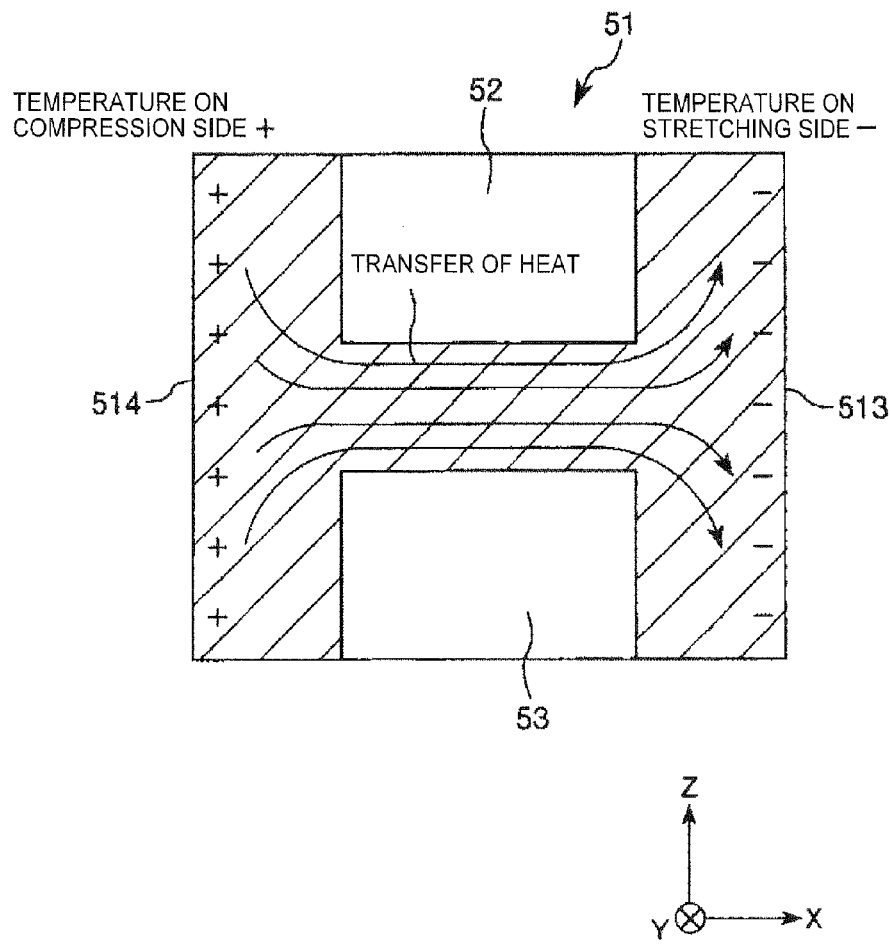
FIG. 6 is a cross-sectional view of a resonating arm illustrating heat conduction during flexural vibration.
Figure 7:
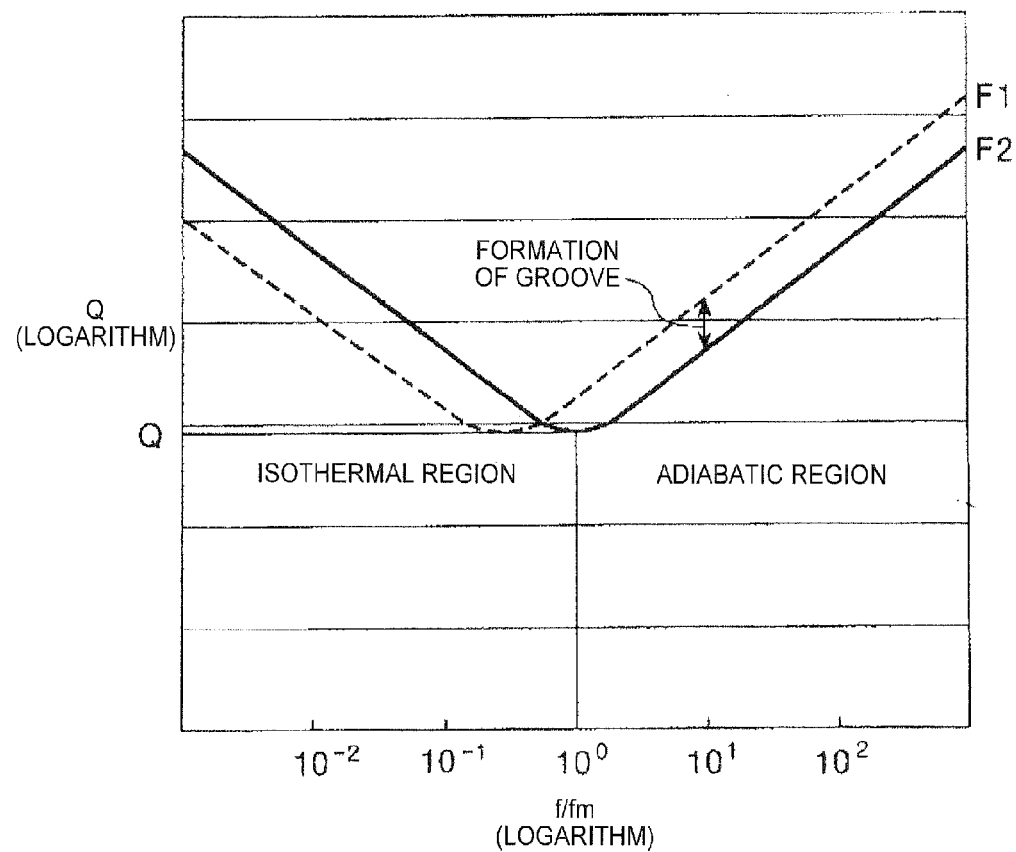
FIG. 7 is a graph illustrating a relationship between a Q value and f/fm.
Figure 8:
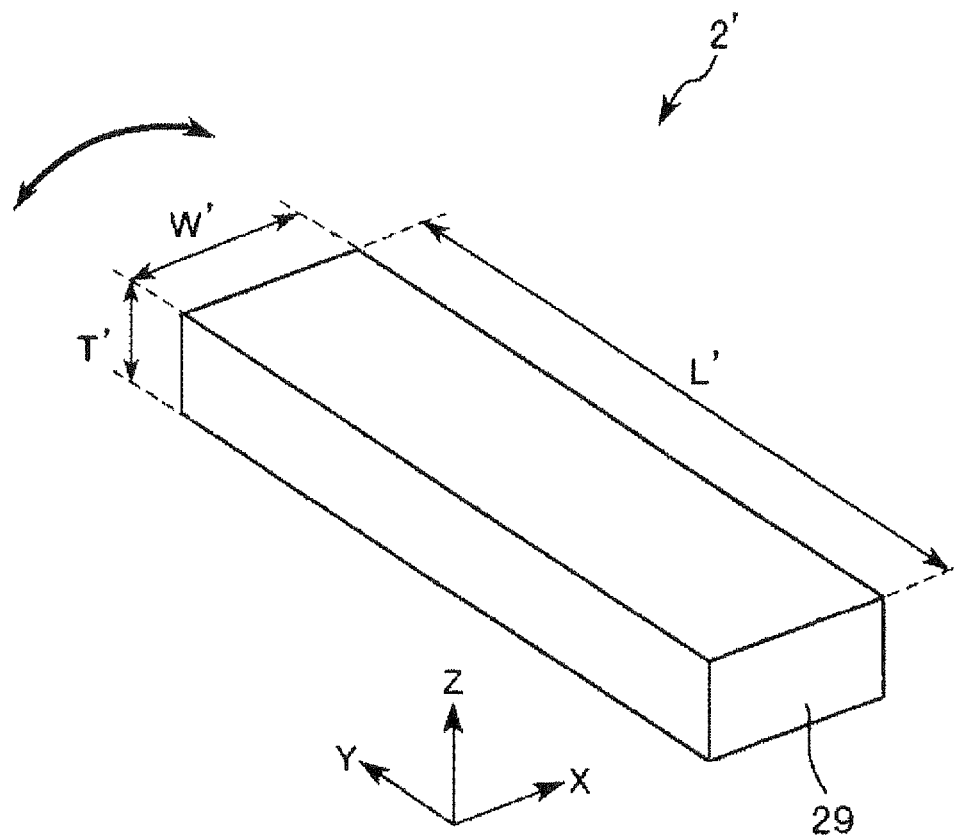
FIG. 8 is a plan view of a resonation element model using a simulation.
Figure 9:
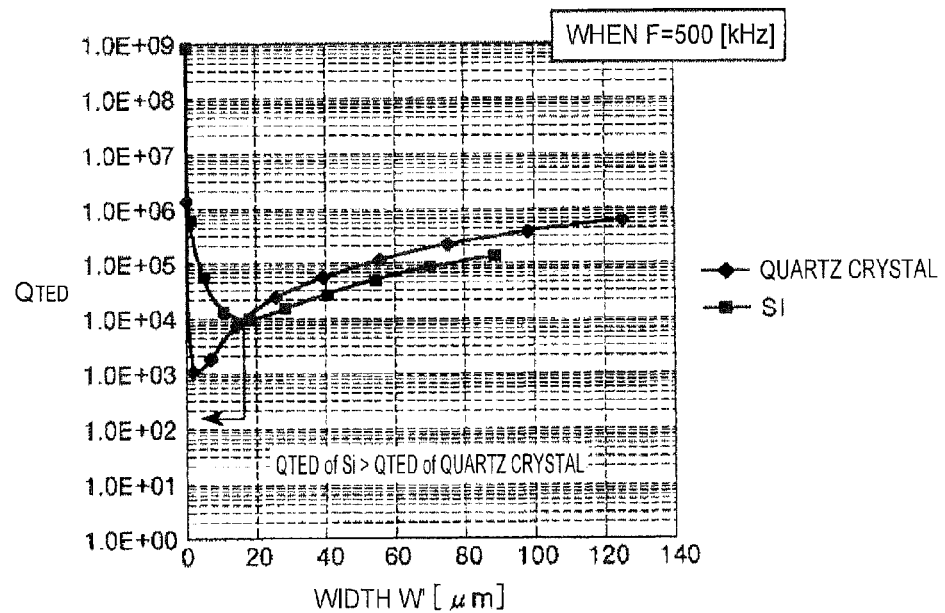
FIG. 9 is a graph illustrating a relationship between $Q_{TED}$ and a width W'.
Figure 10:
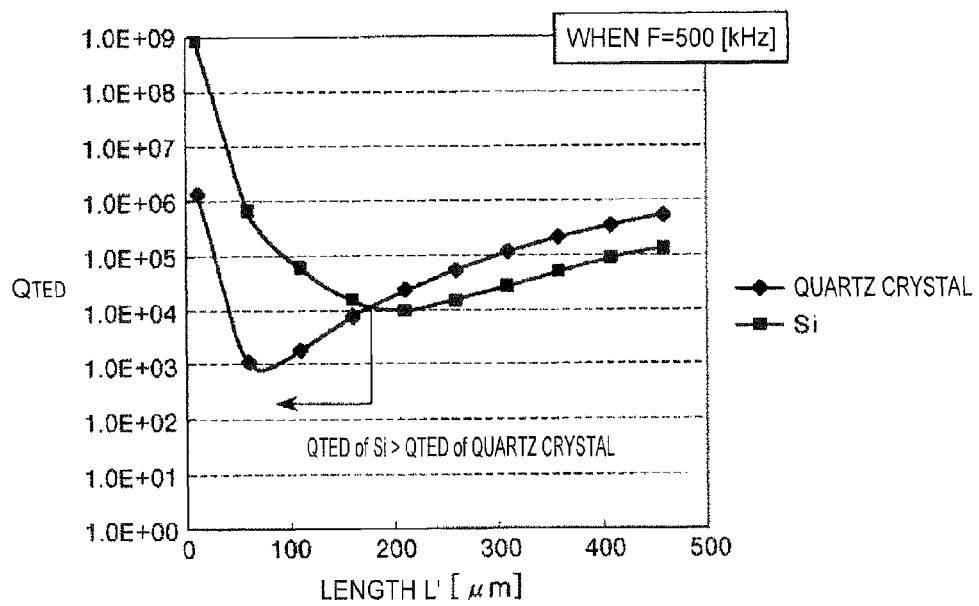
FIG. 10 is a graph illustrating a relationship between $Q_{TED}$ and a length L'.
Figure 11:
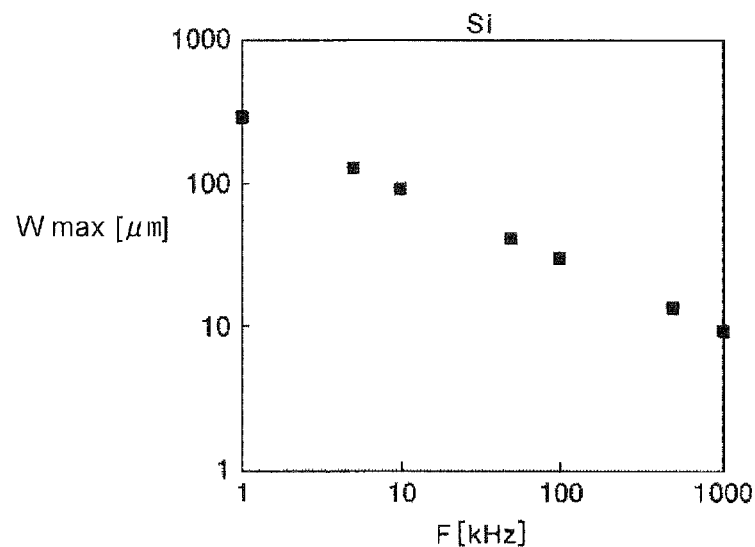
FIG. 11 is a graph illustrating a relationship between the width W' of a resonating arm and a resonation frequency f.
Figure 12:
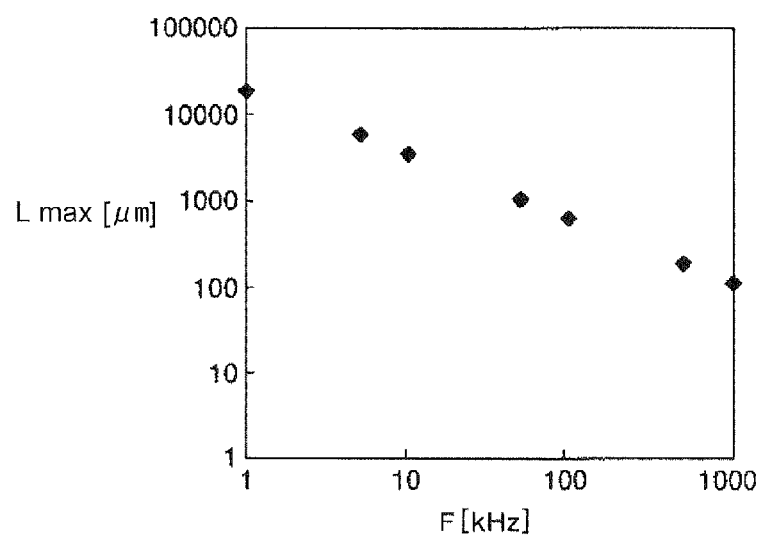
FIG. 12 is a graph illustrating a relationship between the length L' of the resonating arm and the resonation frequency f.

FIG. 1 is a plan view of a resonator according to a first embodiment of the invention. FIG. 2 is a cross-sectional view taken along line A-A of FIG. 1. FIG. 3 is a cross-sectional view taken along line B-B of FIG. 1. FIGS. 4A and 4B are plan views illustrating a function of a resonation element shown in FIG. 1. FIG. 5 is a cross-sectional view taken along line C-C of FIG. 1. FIG. 6 is a cross-sectional view of a resonating arm illustrating heat conduction during flexural vibration. FIG. 7 is a graph illustrating a relationship between a Q value and f/fm. FIG. 8 is a plan view of a resonation element model using a simulation. FIG. 9 is a graph illustrating a relationship between $Q_{TED}$ and a width W'. FIG. 10 is a graph illustrating a relationship between $Q_{TED}$ and a length L'. FIG. 11 is a graph illustrating a relationship between the width W' of a resonating arm and a resonation frequency f. FIG. 12 is a graph illustrating a relationship between the length L' of the resonating arm and the resonation frequency f.

Meanwhile, in FIGS. 1 to 6, and 8, an X-axis, a Y-axis and a Z-axis are illustrated as three axes which are at right angles to one another. The tip side of each arrow shown in the drawings is set to "+ (plus)", and the base end side thereof is set to "− (minus)". In addition, a direction (second direction) parallel to the X-axis is defined as an "X-axis direction", a direction (first direction) parallel to the Y-axis is defined as a "Y-axis direction", and a direction (third direction) parallel to the Z-axis is defined as a "Z-axis direction". In addition, a +Z side (upper side in FIGS. 2 and 3) is defined as "upper", and a −Z side (lower side in FIGS. 2 and 3) is defined as "lower".

As shown in FIG. 1, a resonator 1 includes a resonation element 2 and a package 9 that houses the resonation element 2.

Package

As shown in FIGS. 1 and 2, the package (container) 9 includes a box-shaped base 91 having a concave portion 911 which is open to the upper surface, and a plate-like lid 92, bonded to the base 91, which blocks an opening of the concave portion 911. The package 9 has a housing space S formed by the concave portion 911 being blocked by the lid 92, and hermetically houses the resonation element 2 in the housing space S. The inside of the housing space S may be in a decompression (preferably, vacuum) state, and may have an inert gas such as nitrogen, helium or argon sealed.

The configuration material of the base 91 is not particularly limited, but the material to be used may include various types of ceramics such as an aluminum oxide, or various types of resin materials. In addition, the configuration material of the lid 92 is not particularly limited, but the material to be used may include a member having a linear expansion coefficient approximate to that of the configuration material of the base 91. For example, when ceramics as described above are used as the configuration material of the base 91, it is preferably to use an alloy such as Kovar. Meanwhile, the bonding of the base 91 to the lid 92 is not particularly limited, but the bonding can be performed, for example, with a metallization layer interposed therebetween.

In addition, as shown in FIGS. 2 and 3, internal terminals 951, 961, and 962 are provided at the bottom of the concave portion 911 of the base 91.

The internal terminal 951 is electrically connected to a holding arm 7 of the resonation element 2 through a conductive adhesive 93. A terminal 391 provided to a support medium 35 is electrically connected to the internal terminal 961 through, for example, a wiring constituted by a bonding wire. In addition, a terminal 392 provided to a support medium 36 is electrically connected to the internal terminal 962 through, for example, a wiring constituted by a bonding wire.

In addition, the internal terminal 951 is electrically connected to an external terminal 953 provided on the lower surface of the base 91 with a through-electrode (not shown) passing through the base 91 interposed therebetween. The internal terminals 961 and 962 are electrically connected to an external terminal 963 provided on the lower surface of the base 91 with a through-electrode (not shown) passing through the base 91 interposed therebetween. The internal terminals 951, 961, and 962, the terminals 391 and 392, the external terminals 953 and 963, and the through-electrodes are not particularly limited insofar as they have a conductive property, and may include metal coatings and the like obtained by laminating a coating such as Au (gold), Ag (silver), or Cu (copper) on an underlying layer of, for example, Cr (chrome), Ni (nickel), W (tungsten), Ti (titanium) or the like.

Resonation Element

As shown in FIG. 1, the resonation element 2 includes a vibration substrate 25, electrodes 31 and 32, and the support mediums 35 and 36 which are provided with the electrodes 31 and 32.

As shown in FIG. 2, the vibration substrate 25 is fixed to the base 91 through the conductive adhesive 93. In addition, as shown in FIG. 3, the support medium 35 is fixed to the base 91 through a bonding member 94, and the support medium 36 is fixed to the base 91 through a bonding member 95. Meanwhile, the configuration of the bonding members 94 and 95 is not particularly limited, but the bonding members may include adhesives and the like which are configured to include, for example, an epoxy resin, an acrylic resin, a silicon resin, a bismaleimide resin, or the like.

Meanwhile, in the present embodiment, the vibration substrate 25 and the support mediums 35 and 36 are formed separately from each other, but are not limited thereto, and may extend out the support mediums 35 and 36 from a basal portion 4 which is not likely to be influenced by a vibration. In addition, the vibration substrate 25 and the support mediums 35 and 36 may be formed on a surface Si layer by an SOI (Silicon on Insulator) substrate. With such integral formation, a gap distance between a resonating arm 5 and the electrode 31 and a gap distance between a resonating arm 6 and the electrode can be formed accurately, and thus the manufacturing variation of an equivalent series resistance value is reduced.

Vibrating Substrate

In the embodiment of the invention, the vibration substrate 25 is a substrate, formed of single crystal silicon, in which this single crystal silicon is doped with an impurity such as, for example, phosphorus or boron. In this manner, the single crystal silicon is doped with an impurity, and thus the vibration substrate 25 becomes excellent in conductivity.

In addition, in the embodiment of the invention, the vibration substrate 25 is formed of single crystal silicon, and thus has the following advantages.

The single crystal silicon is not likely to be more subject to a fatigue breakdown than polycrystalline silicon, and has high mechanical characteristics. Meanwhile, the polycrystalline silicon has a crystal grain boundary, and has a lower strength than the inside of a crystal in this crystal grain boundary.

Further, since the single crystal silicon does not have a crystal defect or the like in the crystal grain boundary, the vibration substrate 25 formed of single crystal silicon can exhibit stable frequency characteristics for a long period of time, as compared to a vibration substrate formed of polycrystalline silicon. That is, it is possible to achieve an increase in the life span of the vibration substrate 25.

In addition, by the single crystal silicon being used, and thus the generation of residual stress in the vibration substrate 25 can be suppressed or prevented in a process of manufacturing the vibration substrate 25. Therefore, even when micromachining is applied to the vibration substrate 25, the generation of deformation in the vibration substrate 25 can be suppressed or prevented.

In addition, by the single crystal silicon being used, deformation over time such as warpage is not likely to occur in the vibration substrate 25, and thus an increase or the like in vibration leakage associated with the deformation can be suppressed or prevented.

In addition, polycrystalline silicon which is formed by film formation generally has a thickness of approximately 0.1 to 5 µm, whereas single crystal silicon has a tendency to be formed to have a thickness of approximately 10 to 300 µm. Therefore, when an in-plane flexural vibration having a high effect of suppressing vibration leakage is used, an increase in excitation area is facilitated, and thus an equivalent series resistance value can be further reduced.

Hereinafter, the configuration of the vibration substrate 25 will be described.

As shown in FIG. 1, the vibration substrate 25 includes the basal portion 4, a pair of (two) resonating arms (first and second resonating arms) 5 and 6 extending out in the +Y-axis direction from one end of the basal portion 4, and the holding arm 7 extending out in the +Y-axis direction from the tip of the basal portion 4. The basal portion 4, the resonating arms 5 and 6, and the holding arm 7 are formed integrally.

In addition, as described above, the holding arm 7 is fixed to the base 91 through the conductive adhesive 93 (see FIG. 2). For this reason, the basal portion 4 and the resonating arms 5 and 6 are separated from the base 91 by a predetermined distance.

In addition, the thickness (thickness of the resonating arms 5 and 6 and the basal portion 4) T of the vibration substrate 25 is not particularly limited, but is preferably approximately equal to or greater than 5 µm and equal to or less than 200 µm, and is more preferably approximately equal to or greater than 10 µm and equal to or less than 50 µm. When the thickness T falls below the above lower limit, deformation during a flexural vibration becomes excessive with respect to a predetermined input voltage, and non-linearity becomes larger. For this reason, there may be a concern of a large frequency fluctuation being caused. In addition, when the thickness T exceeds the above upper limit, it is difficult to reduce the thickness of the resonation element 2.

The basal portion 4 is formed in a plate shape, spreading to the XY plane which is a plane parallel to the X-axis and the Y-axis, in which the Z-axis direction is set to a thickness direction. The basal portion 4 includes a portion (main body 41) in which the resonating arms 5 and 6 extend out, and a reduced-width portion 42 in which vibration leakage is reduced.

The reduced-width portion 42 is provided on the base end side (side on the opposite to sides where the resonating arms 5 and 6 extend out) of the main body 41. In addition, the width (length along the X-axis direction) of the reduced-width portion 42 gradually decreases with increasing distance from the resonating arms 5 and 6. With such a reduced-width portion 42, it is possible to effectively suppress the vibration leakage of the resonation element 2.

A specific description with reference to FIGS. 4A and 4B is as follows. Meanwhile, for the purpose of simplifying description, the shape of the resonation element 2 is assumed to be symmetric with respect to a predetermined axis parallel to the Y-axis.

First, as shown in FIG. 4A, a case where the reduced-width portion 42 is not provided will be described. When the resonating arms 5 and 6 are flexurally deformed so as to be separated from each other, displacement close to a clockwise rotational motion, as shown by an arrow, is generated in the main body 41 in the vicinity to which the resonating arm 5 is connected, and displacement close to a counterclockwise rotational motion, as shown by an arrow, is generated in the main body 41 in the vicinity to which the resonating arm 6 is connected (however, since the rotational motion is not strictly a motion which is capable of rotation, the wording "close to a rotational motion" is used for the sake of convenience). Since X-axis direction components of these displacements face in opposite directions to each other, the components are offset in the central portion of the main body 41 in the X-axis direction, and displacement in the +Y-axis direction remains (strictly, displacement in the Z-axis direction also remains, but will be omitted herein). That is, the central portion of the main body 41 in the X-axis direction (second direction) is flexurally deformed so as to be displaced in the +Y-axis direction. When an adhesive is formed in the central portion of the main body 41, having the +Y-axis direction displacement, in the Y-axis direction, and the main body is fixed to a package through the adhesive, elastic energy associated with the +Y-axis direction displacement leaks to the outside through the adhesive. This is a loss of vibration leakage, and a deterioration in Q value is caused, which results in a deterioration in equivalent series resistance value.

On the other hand, as shown in FIG. 4B, when the reduced-width portion 42 is provided, the reduced-width portion 42 has an arch-shaped (curved) contour, and thus the above-mentioned displacements close to a rotational motion are jammed to each other in the reduced-width portion 42. That is, in the central portion of the reduced-width portion 42 in the X-axis direction, displacements in the X-axis direction are offset similarly to the central portion of the main body 41 in the X-axis direction, and displacements in the Y-axis direction are suppressed simultaneously. Further, since the contour of the reduced-width portion 42 is arch-shaped, the displacement in the +Y-axis direction to be generated in the main body 41 is also suppressed. As a result, the +Y-axis direction displacement of the central portion of the basal portion 4 in the X-axis direction when the reduced-width portion 42 is provided becomes much smaller than in a case when the reduced-width portion 42 is not provided. That is, it is possible to obtain the resonation element 2 having small vibration leakage.

Meanwhile, in the present embodiment, the contour of the reduced-width portion 42 is arch-shaped, but is not limited thereto insofar as the above-mentioned action is exhibited. For example, the contour of the reduced-width portion may be formed in a stepped shape by a plurality of straight lines.

The resonating arms 5 and 6 extend out in the +Y-axis direction from the tip of the basal portion 4 so as to be lined up in the X-axis direction and be parallel to each other. In addition, each of the resonating arms 5 and 6 is formed in a longitudinal shape, and is configured such that the base end thereof serves as a fixed end, and that the tip thereof serves as a free end.

The resonating arms 5 and 6 include arms 51 and 61, and weight portions 59 and 69, provided at the tips of the arms 51 and 61, which have a larger length along the X-axis direction than that of the arms 51 and 61. The widths (lengths in the X-axis direction) of the arms 51 and 61 are increased so as to offset flexural vibration frequencies which are reduced by the weight portions 59 and 69, and thus it is possible to increase a flow path of heat which is generated in the arms 51 and 61 during a flexural vibration, in a state where the flexural vibration frequency is maintained constant to a predetermined frequency (for example, 32.768 kHz). Thereby, in a region having a resonation frequency higher than a thermal relaxation frequency (described later), it is possible to increase a Q value by reducing a thermo-elastic loss.

In addition, the lengths (lengths along in the Y-axis direction) of the arms 51 and 61 are shortened so as to offset flexural vibration frequencies which are reduced by the weight portions 59 and 69, and thus it is possible to achieve a reduction in size in a state where the flexural vibration frequency is maintained constant to a predetermined frequency (for example, 32.768 kHz).

Meanwhile, the weight portions 59 and 69 are formed as wide-width portions having a larger width along in the X-axis direction than that of the arms 51 and 61, but may have a larger mass per unit length in the Y-axis direction than that of the arms 51 and 61, without being limited thereto. For example, the weight portions 59 and 69 may be configured to have a larger thickness along the Z-axis direction than that of the arms 51 and 61, while being maintained to have the same width along the X-axis direction as that of the arms 51 and 61. In addition, the weight portions 59 and 69 may be configured by a metal such as Au being formed to be thick on the surfaces of the arms 51 and 61 corresponding to the weight portions 59 and 69. Further, the weight portions 59 and 69 may be constituted by a substance having a mass density larger than that of the arms 51 and 61.

In addition, the weight portion may not be formed as necessary.

As shown in FIGS. 1, 4A, 4B, and 5, the arm 51 includes a pair of main surfaces (front and back main surfaces) 511 and 512 constituted by the XY plane, that is, using the Z-axis direction as a normal line, and a pair of lateral sides 513 and 514, constituted by the YZ plane, which connect a pair of main surfaces 511 and 512. In addition, the arm 51 includes a bottomed groove 52 which is open to the main surface 511, and a bottomed groove 53 which is open to the main surface 512. Each of the grooves 52 and 53 extends in the Y-axis direction, and is configured such that the tip thereof is located at a boundary portion between the arm 51 and the weight portion 59, and that the base end thereof is located at the basal portion 4. Such an arm 51 is formed in a substantially H-shaped transverse cross-sectional shape in portions where the grooves 52 and 53 are formed.

In this manner, the grooves 52 and 53 are formed in the resonating arm 5, and thus it is possible to achieve a reduction in a thermo-elastic loss, and to exhibit excellent resonation characteristics. Hereinafter, regarding the above, the resonating arm 5 will be described in detail by way of example.

The resonating arm 5 is flexurally vibrated in an approximately in-plane direction (XY plane direction) by applying an alternating voltage between the electrodes 31 and 32. As shown in FIG. 6, during this flexural vibration, the contraction of the lateral side 513 of the arm 51 causes the lateral side 514 to expand, and on the contrary, the expansion of the lateral side 513 causes the lateral side 514 to contract. When the resonating arm 5 does not bring about the Gough-Joule effect (energy elasticity is dominant over entropy elasticity), the temperature of the contracting lateral side out of the lateral sides 513 and 514 rises, and the temperature of the expanding lateral side drops. Therefore, a difference in temperature occurs between the lateral side 513 and the lateral side 514, that is, in the inside of the arm 51. The loss of vibrational energy occurs due to heat conduction resulting from such a difference in temperature, whereby the Q value of the resonation element 2 is reduced. The loss of energy associated with such a reduction in the Q value is referred to as a thermo-elastic loss.

In a resonation element vibrating in a flexural vibration mode which has such a configuration as the resonation element 2, when the flexural vibration frequency (mechanical flexural vibration frequency) f of the resonating arm 5 changes, and the flexural vibration frequency of the resonating arm 5 is coincident with the thermal relaxation frequency fm, the Q value is minimized. This thermal relaxation frequency fm can be obtained by fm=$1/(2\pi\tau)$ (herein, $\eta$ is the ratio of the circumference of a circle to its diameter, and $\tau$ is a relaxation time required for the temperature difference to be set to be e−1 times due to thermal conduction when e is set to the Napier's constant).

In addition, when the thermal relaxation frequency in a case where the resonating arm 5 is assumed to have a flat-plate structure (structure of which the cross-sectional shape is rectangular) is set to fm0, fm0 [Hz] can be obtained by the following expression.

$$fm0 = \pi k/(2\rho C p a^2) \tag{5}$$

Meanwhile, $\pi$ is the ratio of the circumference of a circle to its diameter, k [N/(K·s)] is the thermal conductivity of the resonating arm 5 in a resonation direction, $\rho$ [kg/m$^3$] is the mass density of the resonating arm 5, Cp [J/(kg·K)] is the heat capacity of the resonating arm 5, and a[m] is the width of the resonating arm 5 in a resonation direction. When the constant of the material itself (that is, quartz crystal) of the resonating arm 5 is input to the thermal conductivity k, the mass density $\rho$, and the heat capacity Cp of Expression (5), the obtained thermal relaxation frequency fm0 is equal to a value when the resonating arm 5 is not provided with the grooves 52 and 53.

In the resonating arm 5, the grooves 52 and 53 are formed so as to be located between the lateral sides 513 and 514. For this reason, a heat transfer path for performing temperature equilibrium through heat conduction on the difference in temperature between the lateral sides 513 and 514 during the flexural vibration of the resonating arm 5 is formed so as to go around the grooves 52 and 53, and the heat transfer path becomes longer than the linear distance (shortest distance) between the lateral sides 513 and 514. For this reason, as compared to a case where the resonating arm 5 is not provided with the grooves 52 and 53, the relaxation time τ becomes longer, and the thermal relaxation frequency fm becomes lower.

FIG. 7 is a graph illustrating f/fm dependency of the Q value of a resonation element in a flexural vibration mode. In the drawing, a curve F1 shown by a dotted line illustrates a case where a groove is formed in the resonating arm as in the resonation element 2 (case where the transverse cross-section of the resonating arm is H-shaped), and a curve F2 shown by a solid line illustrates a case where a groove is not formed in the resonating arm (case where the transverse cross-section of the resonating arm is rectangular). As shown in the drawing, the shapes of the curves F1 and F2 do not change, but the curve F1 shifts in the direction of frequency drop with respect to the curve F2, in association with a drop in thermal relaxation frequency fm as described above. Therefore, when the thermal relaxation frequency in a case where a groove is formed in the resonating arm as in the resonation element 2 is set to fm1, the following Expression (6) is satisfied, and thus the Q value of the resonation element in which the groove is formed in the resonating arm always becomes larger than the Q value of the resonation element in which the groove is not formed in the resonating arm.

$$f > \sqrt{fm0 fm1} \qquad (6)$$

Further, when a limitation to the relation of f/fm0>1 is made, it is possible to obtain a higher Q value.

In addition, in FIG. 7, a region having a relation of f/fm<1 is also called an isothermal region, and in this isothermal region, the Q value becomes larger as f/fm becomes smaller. This is because the temperature difference within the resonating arm as described above is not more likely to occur as the mechanical frequency of the resonating arm becomes lower (the vibration of the resonating arm becomes slower). Therefore, in the limit when f/fm is brought infinitely close to 0 (zero), an isothermal quasi-static process is used, and a thermo-elastic loss comes infinitely close to 0 (zero). On the other hand, a region of f/fm>1 is also called an adiabatic region, and in this adiabatic region, the Q value becomes larger as f/fm becomes larger. This is because, as the mechanical frequency of the resonating arm becomes higher the switching of the temperature rise and temperature drop on each lateral side speeds up, and the time for the thermal conduction as described above to occur runs out. Therefore, in the limit when f/fm is infinitely increased, an adiabatic process is used, and a thermo-elastic loss comes infinitely close to 0 (zero). From this, it can be said, in other words, that the satisfaction of the relation of f/fm>1 refers to the location of f/fm at the adiabatic region.

In addition, as described above, when the tip of each of the grooves 52 and 53 extends to the weight portion 59, the concentration of stress in the vicinity of the tip of each of the grooves 52 and 53 is relaxed, and thus a concern of fracture or breakage which is generated when an impact is applied is reduced. In addition, when the base end of each of the grooves 52 and 53 extends to the basal portion 4, the concentration of stress in the vicinity of the boundary portion between the resonating arm 5 and the basal portion 4 is relaxed. For this reason, for example, a concern of fracture or breakage which is generated when an impact is applied is reduced.

In addition, as shown in FIG. 5, the grooves 52 and 53 are preferably formed to be symmetric (vertically symmetric) with respect to a segment that divides the thickness of the arm 51 into two equal parts in the transverse cross-section. Thereby, it is possible to suppress an unnecessary vibration of the resonating arm 5, and to vibrate the resonating arm 5 efficiently in the in-plane direction (XY plane direction) of the vibration substrate 25.

In addition, as shown in FIG. 5, the depths of the grooves 52 and 53 are not particularly limited, but when the depth of the groove 52 is set to D1, and the depth of the groove 53 is set to D2 (D1=D2 in the present embodiment), it is preferable to satisfy a relation of 60%≤(D1+D2)/D<100%. Since a heat transfer path increases in length by satisfying such a relation, it is possible to achieve a reduction in a thermo-elastic loss more effectively in the adiabatic region.

Meanwhile, in the embodiment of the invention, the notation of the frequency is divided into f [Hz] and F [kHz], but both have a relation of f=F×1,000.

As stated above, the arm 51 has been described. Meanwhile, in the present embodiment, the arm 51 is configured such that both the pair of main surfaces 511 and 512 are provided with the grooves 52 and 53, but the grooves may be provided on at least one main surface of the pair of main surfaces 511 and 512. In addition, in the embodiment of the invention, the groove may not be provided as necessary. The groove may not be provided from the viewpoint of impact resistance, and in the isothermal region, it is rather preferable that the main surface is not provided with the groove. Particularly, it is preferable that the groove is not provided in a range of L/3 from the root of the resonating arm, and it is further preferable that the groove is not provided throughout the entire resonating arm. As can be understood from FIG. 7, this is based on the fact that, by the groove being formed, the Q value becomes larger in the adiabatic region, whereas the Q value becomes smaller in the isothermal region.

In addition, the arm 61 has the same configuration as that of the arm 51. That is, as shown in FIGS. 1 and 5, the arm 61 includes a pair of main surfaces 611 and 612 constituted by the XY plane, and a pair of lateral sides 613 and 614, constituted by the YZ plane, which connect the pair of main surfaces 611 and 612. In addition, the arm 61 includes a bottomed groove 62 which is open to the main surface 611, and a bottomed groove 63 which is open to the main surface 612. Each of the grooves 62 and 63 extends in the Y-axis direction, and is configured such that the tip thereof is located at the boundary portion between the arm 61 and the weight portion 69, and that the base end thereof is located at the basal portion 4. In addition, similarly to the arm 51, regarding the arm 61, the same effect as the above-mentioned effect is also obtained by forming the grooves 62 and 63.

The weight portion 59 has a width (length in the X-axis direction) larger than that of the arm 51, and protrudes from the arm 51 to both sides in the X-axis direction. The tip sides of the resonating arms 5 and 6 are configured in this manner, and thus it is possible to increase the masses of the resonating arms 5 and 6 on the tip sides while suppressing the total length L of the resonating arm 5. For this reason, the weight portion 59 is provided, and thus it is possible to further achieve a reduction in the size of the resonation element 2, and to further facilitate to obtain a desired resonance frequency.

In addition, in the present embodiment, the length H of the weight portion 59 is equal to approximately ½ of the length L of the resonating arm 5. However, when the total length (length in the Y-axis direction) of the resonating arm 5 is set to L, and the length (length in the Y-axis direction) of the weight portion 59 is set to H, the resonating arm 5 preferably satisfies the relation of 18.3%≤H/L≤59.3%, more preferably satisfies the relation of 23.8%≤H/L≤53.1%, and further more preferably satisfies the relation of 35.0%≤H/L≤41.0%. Such numerical value range is satisfied, and thus it is possible to increase the Q value of the resonation element 2, and to keep an equivalent series resistance value low in association therewith. Therefore, the resonation element 2 having a particularly small vibration loss and particularly excellent resonation characteristics is obtained.

Here, in the present embodiment, the base end of the resonating arm 5 is set in a place located at the center of width (length in the X-axis direction) of the resonating arm 5 of a segment joining a place in which the lateral side 514 is connected to the basal portion 4 and a place in which the lateral side 513 is connected to the basal portion 4. In addition, the base end of the weight portion 59 is set in a place in which the width thereof is equal to 1.5 times the width of the arm 51 in a tapered portion provided at the tip portion of the arm 51.

In addition, when the width (length in the X-axis direction) of the arm 51 is set to W, and the width (length in the X-axis direction) of the weight portion 59 is set to W1, it is preferable to satisfy the relation of 1.5≤W1/W≤10.0, and it is more preferable to satisfy the relation of 1.6≤W1/W≤7.0. Such a numerical value range is satisfied, and thus it is possible to secure a large width of the weight portion 59. Therefore, even when the length H of the weight portion 59 is relatively short as described above, it is possible to sufficiently exhibit a mass effect of the weight portion 59.

In addition, a weight material for frequency adjustment may be formed on at least one of the front and back main surfaces of the weight portion 59.

In addition, the weight portion 69 has the same configuration as that of the weight portion 59. That is, the weight portion 69 has a width (length in the X-axis direction) larger than that of the arm 61, and protrudes from the arm 61 to both sides in the X-axis direction.

As shown in FIGS. 1 and 3, the weight portion 59 includes a pair of main surfaces (first and second main surfaces) 593 and 594 constituted by the XY plane, and a pair of lateral sides 591 and 592, constituted by a plane (YZ plane in the present embodiment) intersecting the XY plane, which connect the pair of main surfaces 593 and 594. The lateral side 591 and the lateral side 592 are located on both outsides of the resonating arm 5. In addition, similarly, the weight portion 69 also includes a pair of main surfaces (first and second main surface) 693 and 694 constituted by the XY plane, and a pair of lateral sides 691 and 692, constituted by a plane (YZ plane in the present embodiment) intersecting the XY plane, which connect a pair of main surfaces 693 and 694. The lateral side 691 and the lateral side 692 are located on both outsides of the resonating arm 6.

The lateral side 591 is located on the support medium 35 side described later, and the lateral side 691 is located on the support medium 36 side. In addition, the lateral side 592 and the lateral side 692 face each other with a space therebetween.

As shown in FIG. 1, the holding arm 7 is located between the resonating arms 5 and 6, and extends out in the +Y-axis direction from the tip of the basal portion 4. In addition, the tip of the holding arm 7 is located on the basal portion 4 side rather than the base ends of the weight portions 59 and 69.

In addition, as described above, the holding arm 7 has the conductive adhesive 93 bonded to one main surface (surface on the −Z-axis side) side (see FIG. 2). In this manner, the vibration substrate 25 is fixed to the package 9 by the holding arm 7, and thus the providing of a region for fixation to the package 9 in the basal portion 4 can be omitted. As described above, the resonations of the resonating arms 5 and 6 are not likely to be transmitted to the holding arm 7 by the reduced-width portion 42 of the basal portion 4. Therefore, the holding arm 7 is used as a fixation portion for fixation to the package 9, thereby allowing vibration leakage to be effectively reduced.

In addition, the thickness (height) T2 of the holding arm 7 in the Z-axis direction becomes larger than the thickness T of the basal portion 4 and the resonating arms 5 and 6. Meanwhile, the thickness of the basal portion 4 and the thickness of the resonating arms 5 and 6 become equal to each other. The thickness T2 of the holding arm 7 is determined depending on the dimensions or the like of the resonating arms 5 and 6, and is not particularly limited, but is preferably equal to or greater than T×1.1 and equal to or less than T×1.5. Thereby, it is possible to more stably fix the resonation element 2 to the package 9 through the holding arm 7, and to achieve a reduction in the size of the resonator 1. In addition, it is possible to more effectively prevent the resonating arms 5 and 6 and the basal portion 4 from coming into contact with the base 91. Meanwhile, when a mounting pad is provided on the package 9 side, the relation of T2≤T may be established.

In addition, the holding arm 7 includes a tip portion 71 having a substantially constant width (length in the X-axis direction), and a reduced-width portion 72, provided on the base end side rather than the tip portion 71, which has an average width smaller than the average width of the tip portion 71. The reduced-width portion 72 is provided, and thus it is possible to prevent stress from being concentrated on a boundary between the reduced-width portion 72 and the tip portion 71 or a boundary between the reduced-width portion 72 and the basal portion 4 at the time of an impact, and to reduce a concern of damage.

Meanwhile, in FIG. 1, the reduced-width portion 72 is formed in a curvedly hollowed-out shape when seen in plan view from the ±X-axis direction, and the configuration of the reduced-width portion 72 is not limited thereto. For example, the contour thereof may be a reduced-width portion which is formed in a stepped shape by a plurality of straight lines.

The width (minimum width) W5 of the reduced-width portion 72 is preferably 20 to 50% of the width (average width) W4 of the tip portion 71, and is more preferably 25 to 45% thereof (see FIG. 4B). Thereby, it is possible to more reliably keep a resonation frequency in an X common mode in which both the resonating arms 5 and 6 are flexurally vibrated in the X-axis direction away from a resonation frequency in a main mode, and to reduce a concern of the reduced-width portion 72 being damaged by an impact. Therefore, it is possible to obtain the resonator 1 which stably exhibits more excellent resonation characteristics.

Support Medium

As shown in FIGS. 1 and 3, the support mediums 35 and 36 are provided on both sides of the vibration substrate 25. The support medium 35 is disposed facing the resonating arm 5, with a space therebetween, on the lateral side (lateral side on the opposite side to the resonating arm 6) 591 side of the resonating arm 5. In addition, the support medium 36 is disposed facing the resonating arm 6, with a space therebetween, on the lateral side (lateral side on the opposite side to the resonating arm 5) 691 side of the resonating arm 6.

The support mediums 35 and 36 are cuboid in the entire shape, and have the electrodes 31 and 32 formed on the lateral sides (sides intersecting the XY plane) 351 and 361, respectively. In addition, as described above, the terminal 391 is provided on the upper surface of the support medium 35, and the terminal 392 is provided on the upper surface of the support medium 36.

In addition, the length (length in the Y-axis direction) H1 of the support mediums 35 and 36 is substantially the same as the length H of the weight portions 59 and 69. In addition, the height (length along the Z-axis direction) T3 of the support mediums 35 and 36 becomes larger than the height T of the weight portions 59 and 69. Meanwhile, in the present embodiment, the length H1, height T3 and the like of the support mediums 35 and 36 are as described above, but the length H1 and the height T3 of the support mediums 35 and 36 may be determined depending on the dimensions or the like of the electrodes 31 and 32, and are not particularly limited.

In addition, the configuration material of the support mediums 35 and 36 is not particularly limited, but may include, for example, a crystalline material such as quartz crystal, sapphire, or silicon, a ceramics material such as alumina, zirconia, silicon nitride, or silicon carbide, a glass material such as silica glass or borosilicate glass, and the like, and can be used by a combination of one or two or more types of these materials.

Particularly, when the support mediums 35 and 36 are formed of silicon, and when the vibration substrate 25 and the support mediums 35 and 36 are formed on a surface Si layer of an SOI substrate which is doped with an impurity and has a conductive property, and the vibration substrate 25 and the support mediums 35 and 36 are electrically insulated from each other, the formation of the electrodes 31 and 32 and the conductive adhesive 93 are not required, and it is possible to accurately form a gap distance between the resonating arm 5 and the support medium 35 and a gap distance between the resonating arm 6 and the support medium 36. In this case, for example, the vibration substrate 25 is connected to a GND electrode, and a direct-current voltage and an alternating voltage are applied to the support mediums 35 and 36, whereby the resonating arms 5 and 6 perform flexural vibrations in which approach and separation to and from each other are alternately repeated.

Here, the reason for applying a direct-current voltage is as follows. Since an electrostatic force acts more strongly as the gap distance between the resonating arm 5 and the support medium 35 and the gap distance between the resonating arm 6 and the support medium 36 are made smaller, the resonating arms 5 and 6 can be flexurally vibrated effectively, but when the resonation element 2 is formed using wet etching, the resonating arm 5 and the support medium 35 or the resonating arm 6 and the support medium 36 are attached to each other due to a phenomenon called sticking. For this reason, the gap distance between the resonating arm 5 and the support medium 35 and the gap distance between the resonating arm 6 and the support medium 36 are maintained to such an extent that sticking is not generated in a step of forming the resonation element 2, the gap distance between the resonating arm 5 and the support medium 35 and the gap distance between the resonating arm 6 and the support medium 36 are reduced by applying a direct-current voltage when the resonating arms 5 and 6 are flexurally vibrated, and the vibrations thereof are performed by applying an alternating voltage in that state. Therefore, a concern of sticking is reduced, and thus it is possible to obtain the resonation element 2 having a low equivalent series resistance value.

In addition, the separation distance between the support medium 35 and the resonating arm 5 and the separation distance between the support medium 36 and the resonating arm 6 are preferably set to be equal to or less than 10 µm, and are more preferably set to be equal to or less than 1 µm. In this manner, it is possible to reduce an equivalent series resistance value by the action of a larger electrostatic force.

As stated above, the support mediums 35 and 36 have been described. Next, the electrodes 31 and 32 will be described.

Electrode

As described above, the electrode 31 which is a drive electrode is provided on the lateral side 351 of the support medium 35, and the electrode 32 which is a drive electrode is provided on the lateral side 361 of the support medium 36 (see FIGS. 1 and 3). An alternating-current voltage is applied to the electrodes 31 and 32, as a drive voltage. In addition, a direct-current voltage is applied to the electrodes 31 and 32, as necessary, in addition to an alternating voltage.

In addition, the electrode 31 is formed over the entire surface of the lateral side 351. The length of the electrode 31 in the Y direction becomes substantially the same as the length of the weight portion 59 in the Y direction, and the length (height) thereof in the Z direction becomes larger than the thickness of the weight portion 59 in the Z direction. That is, the area of the electrode 31 in the YZ plane becomes larger than the area of the weight portion 59 in the YZ plane. In addition, the electrode 31 is disposed facing the weight portion 59 with a space therebetween so as to include the entire lateral side of the weight portion 59.

In addition, the electrode 32 is formed over the entire surface of the lateral side 361. The length of the electrode 32 in the Y direction becomes substantially the same as the length of the weight portion 69 in the Y direction, and the length (height) thereof in the Z direction becomes larger than the thickness of the weight portion 69 in the Z direction. That is, the area of the electrode 32 in the YZ plane becomes larger than the area of the weight portion 69 in the YZ plane. In addition, the electrode 32 is disposed facing the weight portion 69 with a space therebetween so as to include the entire weight portion 69.

In addition, as shown in FIGS. 1 and 3, the electrode 31 is electrically connected to the terminal 391 through a wiring 395 which is formed on the support medium 35. In addition, the electrode 32 is electrically connected to the terminal 392 through a wiring 396 which is formed on the support medium 36. Meanwhile, when the wiring 395 is configured to electrically connect the electrode 31 to the terminal 391, the configuration (shape or the like) is not particularly limited. In addition, the same is true of the wiring 396.

In addition, the configuration material of the electrodes 31 and 32 is not particularly limited, but examples of materials to be used can include, for example, metal materials such as gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), zirconium (Zr), or a titanium nitride (TiN), and conductive materials such as an indium tin oxide (ITO). Particularly among these materials, since Ni or Au has an coefficient of thermal expansion close to that of a quartz crystal, a Ni layer is used as an underlying later to form an Au layer thereon, and thus it is possible to reduce thermal stress occurring in the electrodes 31 and 32, and to obtain the resonation elements 2 having good long-term reliability (aging characteristics).

As stated above, the configuration of the resonation element 2 has been described.

In such a resonation element 2, when the same alternating voltage is applied to the electrodes 31 and 32, an electrostatic force is generated intermittently between the electrode 31 and the resonating arm 5 (weight portion 59) and between the electrode 32 and the resonating arm 6 (weight portion 69). When an electrostatic attractive force is generated, the tip portion of the resonating arm 5 comes close to the support medium 35 side, and the tip portion of the resonating arm 6 comes close to the support medium 36 side. In addition, when an electrostatic attractive force is not generated, or the electrostatic attractive force weakens, the tip portion of the resonating arm 5 and the tip portion of the resonating arm 6 which come close to the support mediums 35 and 36 tend to return to original position, respectively, due to the restoring forces. In addition, when an electrostatic repulsive force is generated, the tip portions tend to return to the original positions more strongly. In this manner, when the same alternating voltage is applied to the electrodes 31 and 32, the resonating arms 5 and 6 are flexurally vibrated at a predetermined frequency so as to repeat approach and separation to and from each other within the XY plane. That is, the resonating arms 5 and 6 are vibrated in an in-plane flexural reverse-phase mode.

In addition, a direct-current voltage is applied to the electrodes 31 and 32 in addition to an alternating voltage. Thereby, the resonating arm 5 is attracted to the support medium 35, and the resonating arm 6 is attracted to the support medium 36. Thereby, the separation distance between the resonating arm 5 and the support medium 35 and the separation distance between the resonating arm 6 and the support medium 36 are reduced. Thus, as compared to a case where only the alternating voltage is applied, a stronger electrostatic attractive force is generated between the electrode 31 and the resonating arm 5 (weight portion 59), and between the electrode 32 and the resonating arm 6 (weight portion 69). Therefore, when an electrostatic attractive force is generated, the tip portion (weight portion 59) of the resonating arm 5 is more strongly attracted to the support medium 35 side, and the tip portion (weight portion 69) of the resonating arm 6 is more strongly attracted to the support medium 36 side. In this manner, an alternating voltage and a direct-current voltage are applied to the electrodes 31 and 32, and thus it is possible to further increase drive of the resonating arms 5 and 6, and to further improve drive efficiency.

Here, the resonating arms 5 and 6 are displaced greatly toward the tip sides thereof. In the resonation element 2, as described above, the tip portions of the resonating arms 5 and 6 are configured to serve as drive regions which are driven by action of an electrostatic force. Thereby, it is possible to further enhance the drive efficiency of the resonation element 2, and to particularly reduce an equivalent series resistance value. In addition, in the present embodiment, the drive region is a region from the tips of the resonating arms 5 and 6 to L/2, in the resonation element 2. Therefore, it is possible to further enhance the drive efficiency of the resonation element 2, and to further reduce an equivalent series resistance value.

Displacement during a flexural vibration is large in a region from the tip of the resonating arm to L/2, and distortion during a flexural vibration is large in a region from the root of the resonating arm to L/2. For this reason, when a flexural vibration is performed using piezoelectricity, the providing of an excitation region inclusive of the region from the root of the resonating arm to L/2, particularly, a region from the root of the resonating arm to L/3 can cause the resonating arm to be vibrated more efficiently. However, when a flexural vibration is performed using an electrostatic force, the region from the tip of the resonating arm to L/2, particularly, the region from the tip of the resonating arm to L/3 is configured to receive an electrostatic force, and thus it is possible to vibrate the resonating arm more efficiently. The reason is as follows. When the resonating arm is flexurally vibrated using piezoelectricity, the resonating arm is flexurally vibrated by alternately providing stretching and compressive forces to the vicinity of one lateral side in the extending direction of the resonating arm, and alternately providing stretching and compressive forces to the vicinity of the other lateral side, and thus drive of the resonating arm at the root side of the resonating arm in which distortion regarding compression and stretching becomes largest during a flexural vibration gives rise to satisfactory efficiency. On the other hand, when the resonating arm is flexurally vibrated using an electrostatic force, the resonating arm is flexurally vibrated by providing a force in a direction which intersects the extending direction of the resonating arm, and in which the displacement of a flexural vibration is generated greatly, and thus drive of the resonating arm at the tip side of the resonating arm in which displacement becomes largest during the flexural vibration gives rise to satisfactory efficiency. As a result, it is possible to further reduce an equivalent series resistance value in a state where an extreme increase in capacitance is reduced.

Meanwhile, when the resonation element 2 is piezoelectrically driven by a piezoelectric film as mentioned above, the drive region (region in which the piezoelectric film is formed) is preferably a region from the base ends (basal portion 4) of the resonating arms 5 and 6 to L/2. Thereby, in a case of piezoelectric drive, it is possible to further enhance the drive efficiency of the resonation element 2, and to further reduce an equivalent series resistance value.

In addition, in the resonation element which is formed of a silicon material, an electrode film which is connected to a temperature compensation circuit or the like may be formed on the lateral side of the resonating arm, or the resonating arm may be vibrated by the formation of a piezoelectric film and the deformation of the piezoelectric film. When a coating film such as the electrode film or the piezoelectric film is formed on the lateral sides 513, 514, 613, and 614 of the resonation element 2, thermal stress has a tendency to be generated due to a difference in coefficients of thermal expansion between the coating film and the resonating arms 5 and 6, and thus a resonation frequency changes. For this reason, there may be a concern of the aging characteristics of the resonation element 2 deteriorating due to the gradual relaxation of thermal stress caused by a difference in temperature between normal temperature and temperature during the formation of the coating film, and a concern of the hysteresis of a resonation frequency with respect to a temperature change increasing due to the relaxation of thermal stress which is generated while a rise and drop in temperature are alternately repeated.

Consequently, in the resonation element 2, the lateral sides 513, 514, 613, and 614 of the resonating arms 5 and 6 are formed as filmless regions in which the arms 51 and 61 are exposed, that is, the coating film is not formed. Thereby, the above defect can be prevented from occurring. As a result, it is possible to considerably enhance the reliability of the resonation element 2.

Meanwhile, the "filmless region" refers to a region in which the coating film is not formed on the entire surface of the lateral sides 513, 514, 613, and 614, in the present specification. That is, even when the coating film is formed on the lateral sides 513, 514, 613, and 614, the region in a case where some of the lateral sides are exposed is included in the "filmless region".

In addition, in the present embodiment, the coating film is not provided on the lateral sides 513, 514, 613, and 614 of the arms 51 and 61. However, when at least L/3 of the resonating arms 5 and 6 on the base end side (region of L/3 which is occupied by the lateral sides 513, 514, 613, and 614 in the total length of the resonating arms 5 and 6 along the Y-axis direction from the basal portion 4 side) is a filmless region in which the coating film is not provided, it is possible to obtain the same effect as the above-mentioned effect.

Incidentally, in the resonation element 2 which is formed of single crystal silicon, the inventor has performed assiduous examinations, and has found that it is possible to further increase a Q value, and to further reduce an equivalent series resistance value by setting the length L and the width W of the resonating arms 5 and 6 to predetermined dimensions, which leads to the completion of the invention.

That is, the inventor has found that, when the resonation frequency of the resonating arms 5 and 6 is set to F [kHz], the length (width) of the resonating arms 5 and 6 along the X-axis is set to W [μm], and the length of the resonating arms 5 and 6 along the Y-axis is set to L [μm], it is possible to further increase the Q value of the resonator 1, and to further reduce an equivalent series resistance value by satisfying at least one expression of the following Expression (1) and the following Expression (2).

$$W < 10^{A \times Log(F) + B} \quad (1)$$

Herein, A is $-5.006 \times 10^{-1}$, and B is 2.451, and $$L < 10^{C \times log(F) + D} \quad (2)$$

Herein, C is $-7.507 \times 10^{-1}$, and D is 4.268.

Meanwhile, the width W of the resonating arms 5 and 6 is the width W of the arms 51 and 61 in the present embodiment. This is caused by the face that, in the resonating arm which is flexurally vibrated, large distortion is generated at the base end side, that is, the base end side is dominant to a vibration.

In addition, by satisfying both Expression (1) and Expression (2), temperature characteristics are considerably excellent, and a Q value can be further increased. Thus, a considerable increase in reliability is achieved.

In the following, these points will be demonstrated on the basis of simulation results performed by inventor.

FIG. 8 illustrates a resonation element model 2' using a simulation. In the resonation element model 2', a length (width) along the X-axis is set to W' [μm], a length along the Y-axis is set to L' [μm], and a length (thickness) along the Z-axis is set to T' [μm]. In addition, the resonation element model 2' has a surface 29 which is a fixed surface, and is a clamped-clamped beam that flexurally vibrates the inside of the XY plane. In addition, in the resonation element model 2', a resonation element which is formed of single crystal silicon is used. Meanwhile, in the following, although used on behalf of the resonation element model 2', the resonation element 2 or the like in the present embodiment also has little difference from simulation results shown below.

As shown in the following Expression (7), the resonation frequency f of a clamped-clamped beam is proportional to the width W' and is inversely proportional to the square of the length L', but a proportionality coefficient (a in Expression (7)) in this case is slightly dependent on the dimensional ratio between the width W' and the length L', and the dimensional ratio between the thickness T' and the length L'.

$$f = a \times \frac{W'}{L'^2} \quad (7)$$

(in Expression (7), a is a proportionality coefficient)

Consequently, each of the values of the width W', the length L', and the thickness T' of the resonation element model 2' is changed, the proportionality coefficient a when the width W' is changed with the length L' kept constant and the proportionality coefficient a when the width W' is changed with the length L' kept constant are obtained, and an approximate expression is calculated from the obtained value of the proportionality coefficient a. Meanwhile, even when the length L' is changed, approximation to the obtained approximate expression is confirmed. From the viewpoint of the design of a resonation element, a desired resonation frequency f and a desired length L' are set forth as a premise, and thus the width W' is determined from Expression (7).

Based on these points, a Q value ($Q_{TED}$) considering only a thermo-elastic loss of the resonation element model 2' can be obtained by the following Expression (8) and Expression (9).

$$Q_{TED} = \frac{\rho C_p}{c \alpha^2 \Theta} \frac{1 + (f/f_0)^2}{(f/f_0)} \quad (8)$$

$$f_0 = \frac{\pi k}{2 \rho C_p W'^2} \quad (9)$$

(in Expression (8) and Expression (9), ρ is a mass density [kg/m³], Cp is a heat capacity [J/(kg·K)], c is an elastic stiffness constant [N/m²] regarding expansion and contraction in the direction of the length L', Θ is the absolute temperature of the environment [K], f is a resonation frequency [Hz], and k is thermal conductivity [N/(K·s)] regarding the direction of the width W')

FIG. 9 illustrates a relationship between $Q_{TED}$ and the width W' when the resonation frequency f is $500 \times 10^3$ [Hz], that is, F is 500 [kHz].

In a graph shown in FIG. 9, the horizontal axis is the width W', and the vertical axis is $Q_{TED}$. In addition, the graph of FIG. 9 illustrates $Q_{TED}$ in the resonation element model 2' using single crystal silicon, and $Q_{TED}$ in a resonation element model using a Z cut quartz crystal plate. Meanwhile, $Q_{TED}$ in the resonation element model using a Z cut quartz crystal plate is calculated by the same method as the method of obtaining $Q_{TED}$ of the resonation element model 2' using single crystal silicon mentioned above.

In addition, in the following description, the resonation element model 2' using single crystal silicon may be simply referred to as the "resonation element model 2' of Si", and the resonation element model using a Z cut quartz crystal plate may be simply referred to the "resonation element model of a quartz crystal".

According to the graph of FIG. 9, it can be understood that, when the width W' is smaller than a predetermined width (length), $Q_{TED}$ of the resonation element model 2' of Si becomes larger than $Q_{TED}$ of the resonation element model of a quartz crystal. In this manner, when the resonation element model 2' of Si and the resonation element model of a quartz crystal which have the same resonation frequency and the same width are compared with each other, it can be understood that, when the width is smaller than a predetermined width W', there is a region in which $Q_{TED}$ of the resonation element model 2' of Si becomes larger than $Q_{TED}$ of the resonation element model of a quartz crystal. Therefore, it can be understood that, when the width W' is smaller than a predetermined width, the use of the resonation element model 2' of Si brings about more excellent temperature characteristics, and higher $Q_{TED}$ is obtained.

FIG. 10 illustrates a relationship between $Q_{TED}$ and the length L' when the resonation frequency f is $500 \times 10^3$ [Hz], that is, F is 500 [kHz]. Meanwhile, in a graph shown in FIG. 10, the horizontal axis is the length L', and the vertical axis is $Q_{TED}$.

According to the graph of FIG. 10, it can be understood that, when the length L' is smaller than a predetermined length, $Q_{TED}$ of the resonation element model 2' of Si becomes larger than $Q_{TED}$ of the resonation element model of a quartz crystal. In this manner, regarding the length L', similarly to the width W', when the resonation element model 2' of Si and the resonation element model of a quartz crystal which have the same resonation frequency and the same length are compared with each other, it can be understood that, when the length is smaller than a predetermined length L', there is a region in which $Q_{TED}$ of the resonation element model 2' of Si becomes larger than $Q_{TED}$ of the resonation element model of a quartz crystal. Therefore, it can be understood that, when the length L' is smaller than a predetermined numerical value, the use of the resonation element model 2' of Si brings about more excellent temperature characteristics, and higher $Q_{TED}$ is obtained.

In addition, by changing the resonation frequencies f, a relationship between $Q_{TED}$ and the width W' of the resonation element model 2' of Si and a relationship between $Q_{TED}$ and the width W' of the resonation element model of a quartz crystal, at each resonation frequency f, are obtained. A maximum width $W_{max}$ in which $Q_{TED}$ of the resonation element model 2' of Si becomes larger than $Q_{TED}$ of the resonation element model of a quartz crystal, at each resonation frequency f, is calculated.

A relationship between each resonation frequency f and the maximum width $W_{max}$ at the resonation frequency f is shown in FIG. 11. Meanwhile, in a graph shown in FIG. 11, the horizontal axis is the resonation frequency F [kHz], and the vertical axis is the maximum width $W_{max}$ at each resonation frequency F. Meanwhile, $W_{max}$ can be approximated by $Wmax=10^{A \times Log(F)+B}$ (herein, $A=-5.006 \times 10^{-1}$, and $B=2.451$).

From the results of FIG. 11, in a region where the value of W' is smaller than $W_{max}$, $Q_{TED}$ of the resonation element model 2' of Si becomes larger than $Q_{TED}$ of the resonation element model of a quartz crystal. That is, it can be understood that the resonation element 2 having high $Q_{TED}$ is obtained by satisfying Expression (1).

In addition, by changing the resonation frequency f, a relationship between $Q_{TED}$ and the length L' of the resonation element model of a quartz crystal 2' and a relationship between $Q_{TED}$ and the length L' of the resonation element model of Si, at each resonation frequency f, are obtained. A maximum length $L_{max}$ in which $Q_{TED}$ of the resonation element model 2' of Si becomes larger than $Q_{TED}$ of the resonation element model of a quartz crystal, at each resonation frequency f, is calculated.

In addition, a relationship between each resonation frequency f and the maximum length $L_{max}$ at the resonation frequency f is shown in FIG. 12. Meanwhile, in a graph shown in FIG. 12, the horizontal axis is the resonation frequency F [kHz], and the vertical axis is the maximum length $L_{max}$ at each resonation frequency F. Meanwhile, $L_{max}$ can be approximated by $Lmax=10^{C \times log(F)+D}$ (herein, $C=-7.507 \times 10^{-1}$, and $D=4.268$)

From the results of FIG. 12, in a region where the value of L' is smaller than $L_{max}$, $Q_{TED}$ of the resonation element model 2' of Si becomes larger than $Q_{TED}$ of the resonation element model of a quartz crystal. That is, it can be understood that the resonation element 2 having high $Q_{TED}$ is obtained by satisfying Expression (2).

Therefore, it is demonstrated that, by satisfying at least one expression of Expression (1) and Expression (2), a higher Q value is obtained, and the resonation element 2 having more excellent resonation characteristics is formed. In addition, both Expression (1) and Expression (2) are satisfied, and thus the resonation element 2 has a higher Q value and more excellent resonation characteristics.

Meanwhile, in the resonator 1, it is preferable to establish the relation of resonation frequency $F=1$ to $1,000$ [kHz]. Thereby, it is possible to achieve both a reduction in the size of the resonation element 2 and low power consumption.

In addition, from the viewpoint of simple manufacturing of the resonation element 2, the lower limit of the width W is preferably 0.1 μm, and the lower limit of the length L is preferably 1.0 μm.

Meanwhile, it is preferable that the following Expression (3) is satisfied when Expression (1) is satisfied, and the following Expression (4) is satisfied when Expression (2) is satisfied.

$$W < 0.8 \times W_{max} \qquad (3)$$

$$L < 0.8 \times L_{max} \qquad (4)$$

Expressions (3) and (4) are satisfied, and thus a difference in $Q_{TED}$ between the resonation element model 2' of Si and the resonation element model of a quartz crystal becomes more conspicuous as is evident from FIGS. 9 and 10.

Further, it is more preferable that the following Expression (10) is satisfied when Expression (1) is satisfied, and the following Expression (11) is satisfied when Expression (2) is satisfied.

$$W < 0.5 \times W_{max} \qquad (10)$$

$$L < 0.5 \times L_{max} \qquad (11)$$

Expressions (10) and (11) are satisfied, and thus a difference in $Q_{TED}$ between the resonation element model 2' of Si and the resonation element model of a quartz crystal becomes more conspicuous as is evident from FIGS. 9 and 10.

Second Embodiment

Next, a second embodiment of the resonator according to the invention will be described.

Figure 13:
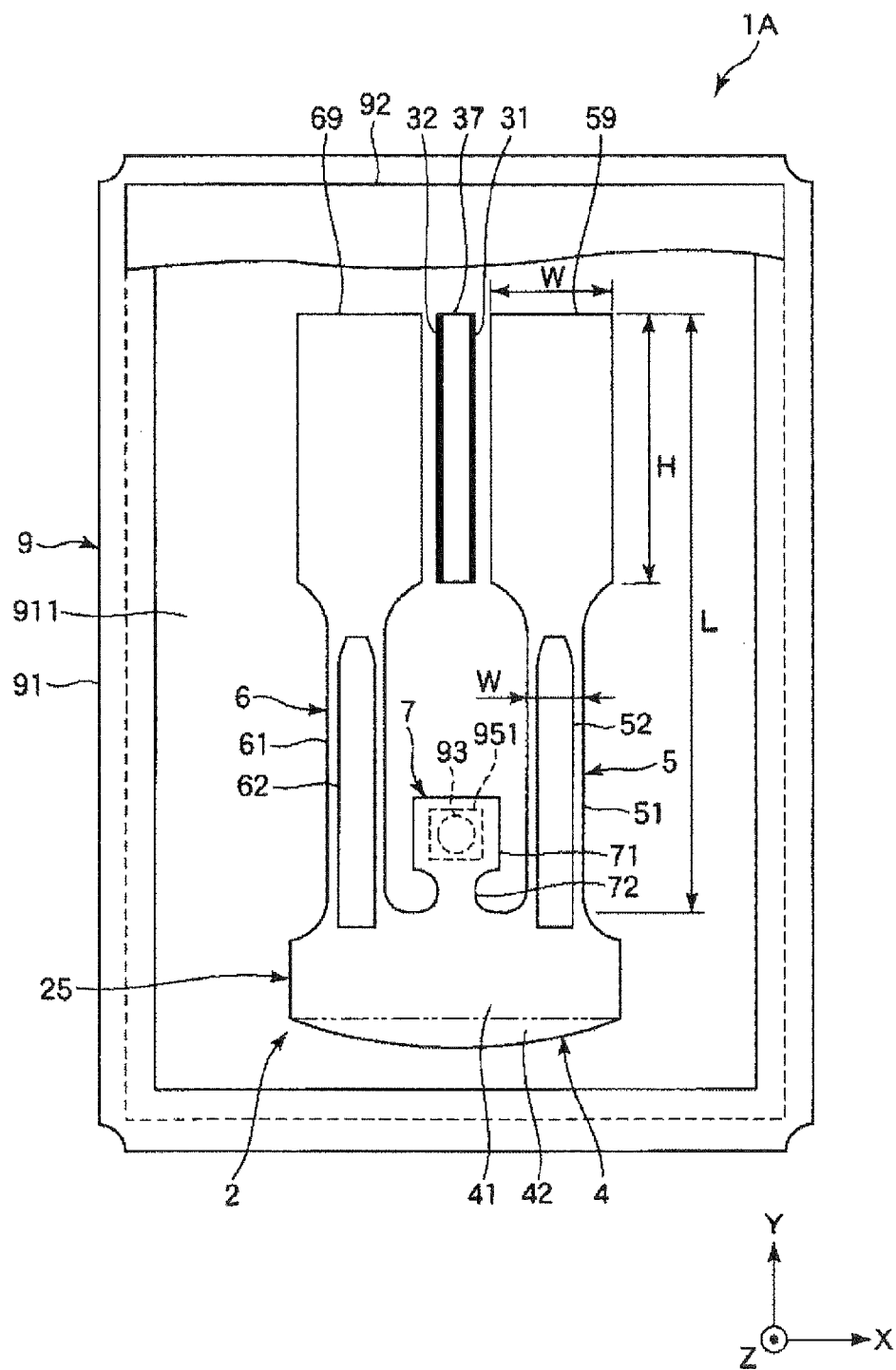
FIG. 13 is a top view of a resonator according to a second embodiment of the invention.

FIG. 13 is a top view of a resonator according to the second embodiment of the invention.

Hereinafter, the resonator of the second embodiment will be described with a focus on differences from the aforementioned first embodiment, and common particulars will not be described below.

The resonator according to the second embodiment of the invention is the same as that in the aforementioned first embodiment, except that the arrangement positions and the number of support mediums are different from the above.

As shown in FIG. 13, in a resonator 1A of the present embodiment, a support medium 37 is disposed between the weight portions 59 and 69. The support medium 37 has a smaller length in the X-axis direction than that of the support mediums 35 and 36 in the first embodiment. The electrode 31 is formed on a surface fronting on the weight portion 59 of the support medium 37, and the electrode 32 is formed on a surface fronting on the weight portion 69 of the support medium 37.

In such a resonator 1A, a flexural vibration within the XY plane is performed similarly to the resonator 1 of the first embodiment. In addition, according to the resonator 1A, it is possible to reduce the length of the package 9 in the X-axis direction to an extent that the support medium outside each of the resonating arms 5 and 6 is omitted, and to achieve a reduction in the size of the resonator 1A.

Third Embodiment

Next, a third embodiment of the resonator according to the invention will be described.

Figure 14:
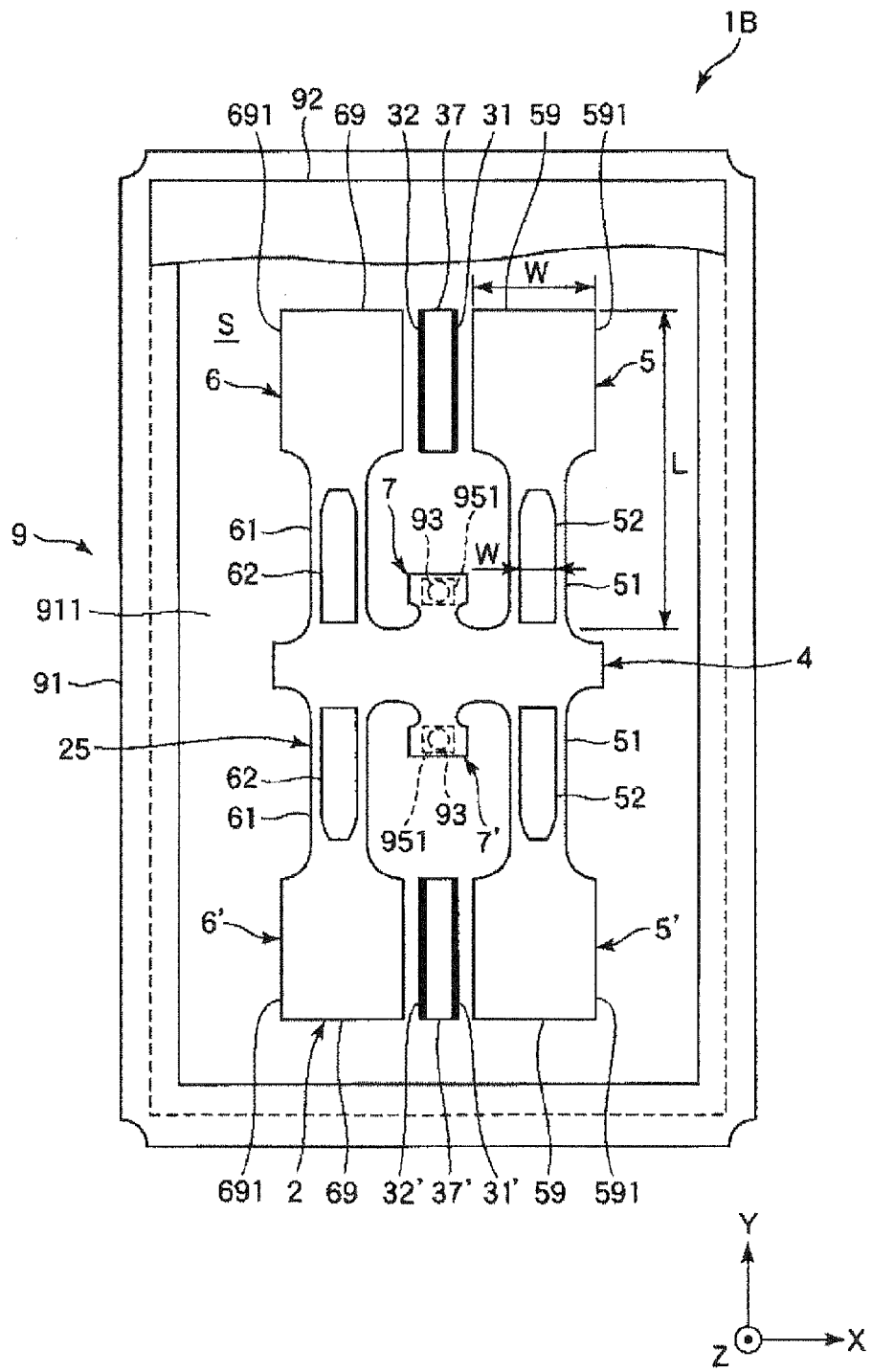
FIG. 14 is a top view of a resonator according to a third embodiment of the invention.

FIG. 14 is a top view of a resonator according to the third embodiment of the invention.

Hereinafter, the resonator of the third embodiment will be described with a focus on differences from the aforementioned first embodiment, and common particulars will not be described below.

The resonator according to the third embodiment of the invention is the same as that in the aforementioned second embodiment, except that the configurations of the resonation elements are different from each other.

As shown in FIG. 14, in the resonator 1B, the resonation element 2 includes a basal portion 4, resonating arms 5, 6, 5', and 6', and holding arms 7 and 7'.

The resonating arms 5' and 6' have the same configuration as that of the resonating arms 5 and 6. The resonating arm 5' extends out in the −Y-axis direction from the opposite side to the resonating arm 5 of the basal portion 4, and the resonating arm 6' extends out in the −Y-axis direction from the opposite side to the resonating arm 6 of the basal portion 4.

In addition, the holding arm 7' has the same configuration as that of the holding arm 7, and extends out in the −Y-axis direction from the opposite side to the holding arm 7 of the basal portion 4.

In addition, the resonator 1B is provided with the support medium 37 and a support medium 37' having the same configuration as that of the support medium 37. This support medium 37' is provided between the resonating arm 5' and the resonating arm 6'. In addition, electrodes 31' and 32' are provided on a pair of lateral sides using the X-axis of the support medium 37' as a normal line, respectively.

In the resonator 1B, when the same alternating voltage is applied to the electrodes 31, 32, 31', and 32', an electrostatic attractive force is generated intermittently between the electrode 31 and the resonating arm 5, between the electrode 32 and the resonating arm 6, between the electrode 31' and the resonating arm 5', and between the electrode 32' and the resonating arm 6'. Thereby, the resonating arms 5 and 6 are flexurally vibrated at a predetermined frequency so as to repeat approach and separation to and from each other within the XY plane. Similarly, the resonating arms 5' and 6' are also flexurally vibrated at a predetermined frequency so as to repeat approach and separation to and from each other within the XY plane.

In such a resonator 1B, the area of the resonation element 2 on which an electrostatic force acts increases to an extent that the resonating arms 5' and 6' are provided. Thereby, in the resonator 1B, an equivalent series resistance value becomes smaller, and a Q value becomes larger.

Fourth Embodiment

Next, a fourth embodiment of the resonator according to the invention will be described.

Figure 15:
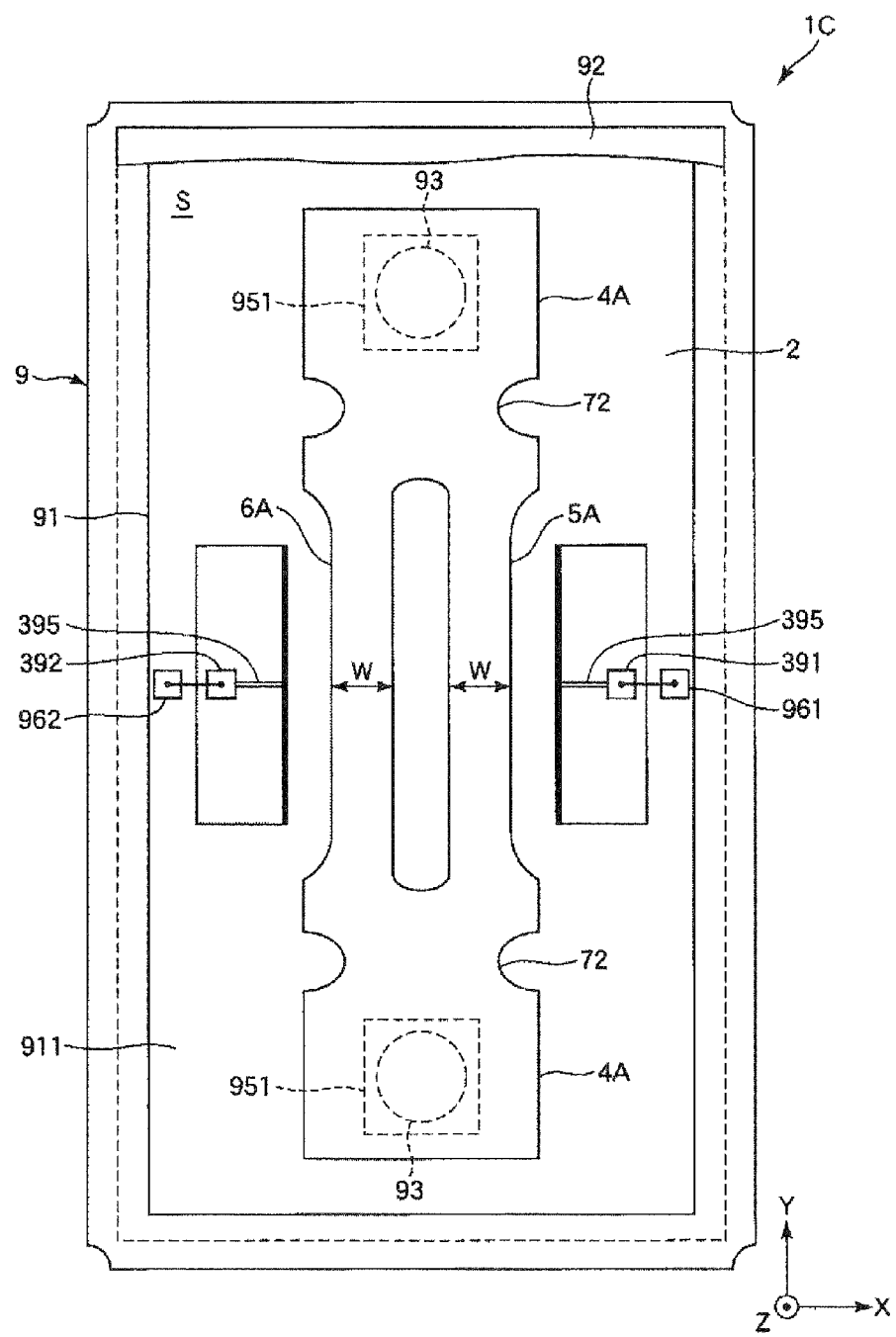
FIG. 15 is a top view of a resonator according to a fourth embodiment of the invention.

FIG. 15 is a top view of a resonator according to the fourth embodiment of the invention.

Hereinafter, the resonator of the fourth embodiment will be described with a focus on differences from the aforementioned first embodiment, and common particulars will not be described below.

The resonator according to the fourth embodiment of the invention is the same as that in the aforementioned second embodiment, except that the configurations of the resonation elements are different from each other.

As shown in FIG. 15, in a resonator 1C, the resonation element 2 includes a pair of basal portions 4A which are separated from each other in the Y-axis direction, and a pair of resonating arms 5A and 6A that connect the respective basal portions 4A.

Each of the basal portions 4A is formed in a block shape, and the surface thereof in the −Z-axis direction is fixed to the base 91 of the package 9. In addition, each of the basal portions 4A is electrically connected to the internal terminal 951 through the conductive adhesive 93.

The pair of resonating arms 5A and 6A extend in the Y-axis direction, and are separated from each other in the X-axis direction. Meanwhile, in the resonating arms 5A and 6A, the weight portion and the groove are omitted.

In addition, in the resonator 1C, the support medium 35 is provided on the −X-axis side of the resonating arm 5A so as to be separated from the resonating arm 5A, and the support medium 36 is provided on the +X-axis side of the resonating arm 6A so as to be separated from the resonating arm 6A.

In such a resonator 1C, the length thereof can be made smaller than those of the resonators 1, 1A, and 1B in the X-axis direction. In addition, in the resonating arms 5A and 6A, free ends are omitted, and both ends serve as fixed ends. Therefore, even when the resonator 1C is used in a direction in which the direction of gravitation and the Z-axis direction coincide with each other, it is possible to reduce the influence of gravitation on the resonating arms 5A and 6A. In addition, it is also possible to use the resonator 1C as a physical quantity sensor by detecting stress which is applied between the respective basal portions 4A.

Fifth Embodiment

Next, a fifth embodiment of the resonator according to the invention will be described.

Figure 16A:
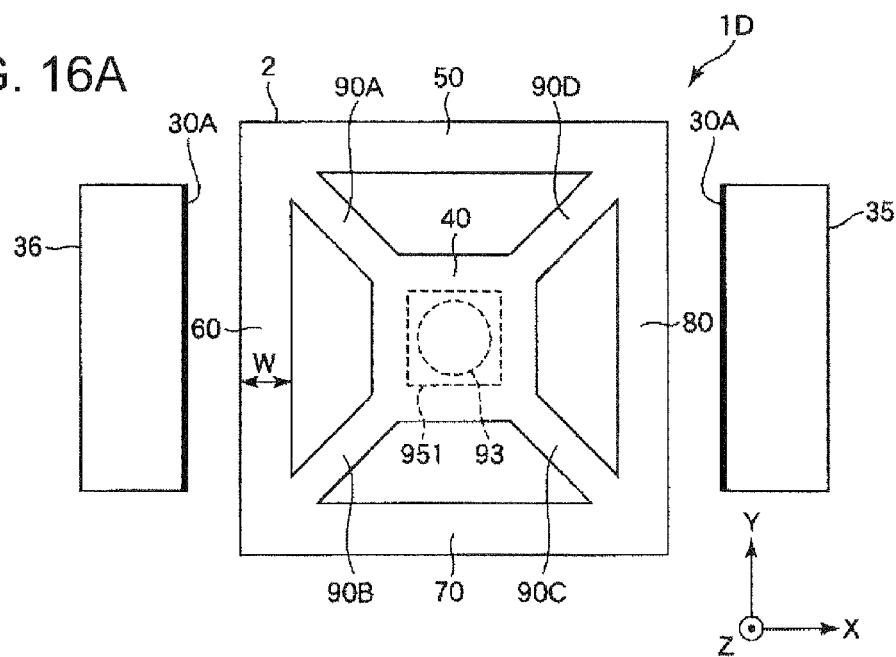
FIGS. 16A to 16C are diagrams illustrating a resonator according to a fifth embodiment of the invention.
Figure 16B:
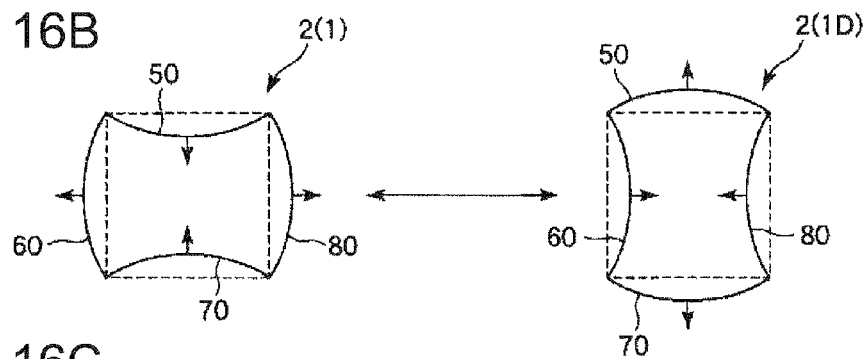
Figure 16C:
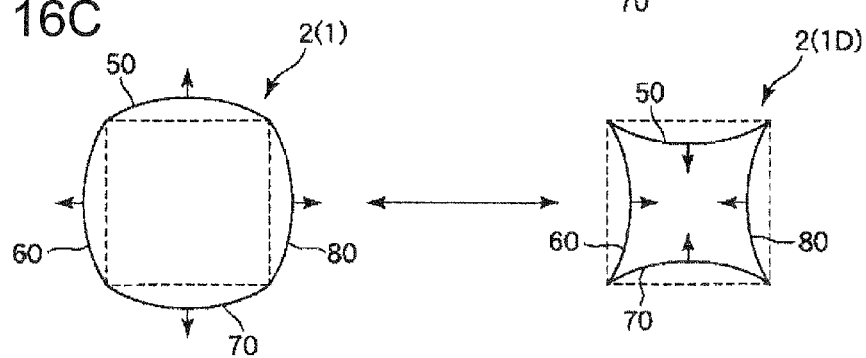

FIGS. 16A to 16C are diagrams illustrating a resonator according to the fifth embodiment of the invention; FIG. 16A is a top view, and FIGS. 16B and 16C are schematic diagrams illustrating a flexural vibration of a resonation element shown in FIG. 16A.

Hereinafter, the resonator of the fifth embodiment will be described with a focus on differences from the aforementioned first embodiment, and common particulars will not be described below.

The resonator according to the fifth embodiment of the invention is the same as that in the aforementioned first embodiment, except that the configurations of the resonation elements are different from each other.

As shown in FIG. 16A, in a resonator 1D, the resonation element 2 includes a basal portion 40, resonating arms 50, 60, 70, and 80, separated from the basal portion 40, which are provided so as to surround the basal portion 40, and four long-length connecting portions 90A, 90B, 90C, and 90D that connect the basal portion 40 and each of the resonating arms 50 to 80.

The basal portion 40 is formed in a substantially rectangular shape, and the surface thereof on the −Z-axis side is fixed to the base 91 of the package 9.

The resonating arm 50 is provided on the +Y-axis side of the basal portion 40, and extends along the X-axis direction. The resonating arm 60 is provided on the −X-axis side of the basal portion 40, and extends along the Y-axis direction. The resonating arm 70 is provided on the −Y-axis side of the basal portion 40, and extends along the X-axis direction. The resonating arm 80 is provided on the +X-axis side of the basal portion 40, and extends along the Y-axis direction. Meanwhile, the widths W of each of the resonating arms 50 to 80 are the same as each other.

In addition, the end of the resonating arm 50 on the −X-axis side and the end of the resonating arm 60 on the +Y-axis side are connected to each other. In addition, the end of the resonating arm 60 on the −Y-axis side and the end of the resonating arm 70 on the −X-axis side are connected to each other. In addition, the end of the resonating arm 70 on the +X-axis side and the end of the resonating arm 80 on the −Y-axis side are connected to each other. The end of the resonating arm 80 on the +Y-axis side and the end of the resonating arm 50 on the +X-axis side are connected to each other.

The connecting portion 90A connects the basal portion 40 and a portion in which the end of the resonating arm 50 on the −X-axis side and the end of the resonating arm 60 on the +Y-axis side are connected to each other. The connecting portion 90B connects the basal portion 40 and a portion in which the end of the resonating arm 60 on the −Y-axis side and the end of the resonating arm 70 on the −X-axis side are connected to each other. The connecting portion 90C connects the basal portion 40 and a portion in which the end of the resonating arm 70 on the +X-axis side and the end of the resonating arm 80 on the −Y-axis side are connected to each other. The connecting portion 90D connects the basal portion 40 and a portion in which the end of the resonating arm 80 on the +Y-axis side and the end of the resonating arm 50 on the +X-axis side are connected to each other.

In such a resonator 1D, when the electrodes 30A are respectively provided on the −X-axis side of the resonating arm 60 and the +X-axis side of the resonating arm 80, each resonating arm is flexurally vibrated as follows.

When the same alternating voltage is applied to each electrode 30A, according to the same principle as that in each of the embodiments, as shown in FIG. 16B, the resonating arm 60 and the resonating arm 80 are flexurally deformed to the outside, and the resonating arm 50 and the resonating arm 70 are flexurally deformed to the inside. When the resonating arm 60 and the resonating arm 80 are flexurally deformed to the inside, the resonating arm 50 and the resonating arm 70 are flexurally deformed to the outside. Each of the resonating arms 50 to 80 repeats such deformation, and performs a flexural vibration.

In addition, as shown in FIG. 16C, the resonator 1D is flexurally vibrated as follows when the electrode 30A is provided in the vicinity of each of the resonating arms 50 to 80 (not shown).

When the same alternating voltage is applied each electrode 30A, according to the same principle as the above-mentioned embodiment, each of the resonating arms 50 to is flexurally deformed to the outside. Each of the resonating arms 50 to 80 is flexurally deformed to the inside due to a restoring force. Each of the resonating arms 50 to 80 repeats such deformation, and performs a flexural vibration.

In such a resonator 1D, as is evident from FIGS. 16A to 16C, the centroid of the resonation element 2 is fixed to the package 9. Therefore, even when an external force is applied involuntarily to the resonator 1D, it is possible to effectively prevent the resonation element 2 from being separated from the base 91 of the package 9. Thus, the resonator 1D has excellent impact resistance.

Sixth Embodiment

Next, a sixth embodiment of the resonator according to the invention will be described.

Figure 17A:
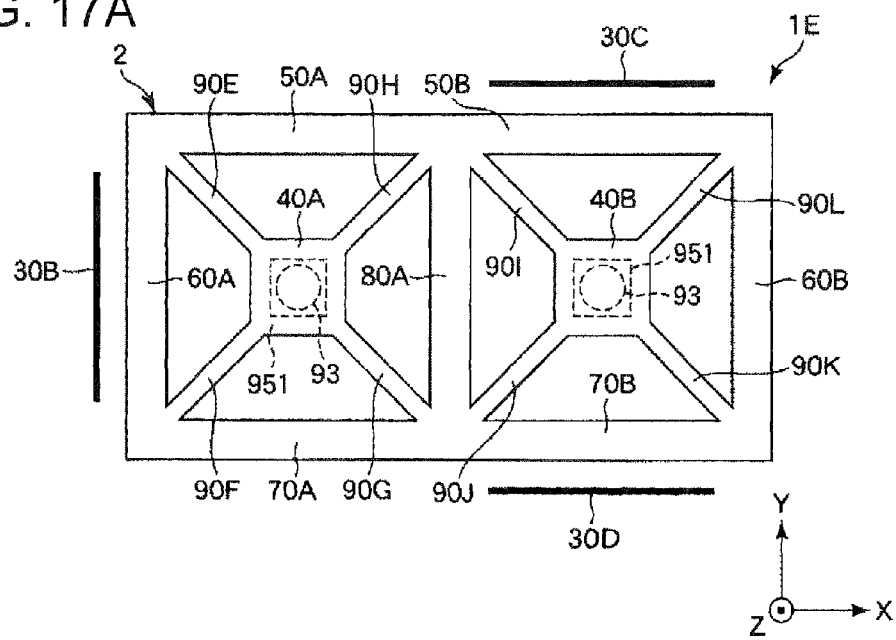
FIGS. 17A and 17B are diagrams illustrating a resonator according to a sixth embodiment of the invention.
Figure 17B:
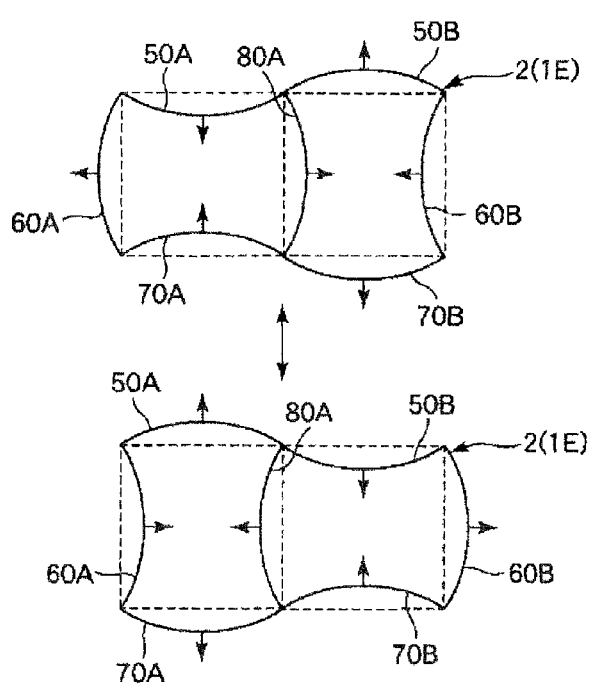

FIGS. 17A and 17B are diagrams illustrating a resonator according to the sixth embodiment of the invention; FIG. 17A is a top view, and 17B is a schematic diagram illustrating a flexural vibration of a resonation element shown in FIG. 17A.

Hereinafter, the resonator of the sixth embodiment will be described with a focus on differences from the aforementioned fifth embodiment, and common particulars will not be described below.

The resonator according to the sixth embodiment of the invention is the same as that of the aforementioned fifth embodiment, except that the configurations of the resonation elements are different from each other.

As shown in FIG. 17A, in a resonator 1E, the resonation element 2 includes two basal portions 40A and 40B, seven resonating arms 50A, 60A, 70A, 80A, 50B, 60B, and 70B, separated from the basal portions 40A and 40B, which are provided so as to surround the basal portions 40A and 40B, and connecting portions 90E, 90F, 90G, 90H, 90I, 90J, 90K, and 90L.

The basal portions 40A and 40B are formed in a rectangular, and are separated from each other in the X-axis direction. In addition, the basal portions 40A and 40B are fixed to the base 91 of the package 9.

The resonating arm 50A is provided on the +Y-axis side of the basal portion 40A, and extends in the X-axis direction. The resonating arm 60A is provided on the −X-axis side of the basal portion 40A, and extends in the Y-axis direction. The resonating arm 70A is provided on the −Y-axis side of the basal portion 40A, and extends in the X-axis direction. The resonating arm 80A is provided between the basal portion 40A and the basal portion 40B, and extends in the Y-axis direction. The resonating arm 50B is provided on the +Y-axis side of the basal portion 40B, and extends in the X-axis direction. The resonating arm 60B is provided on the +X-axis side of the basal portion 40B, and extends in the Y-axis direction. The resonating arm 70B is provided on the −Y-axis side of the basal portion 40B, and extends in the X-axis direction.

In addition, the end of the resonating arm 50A on the −X-axis side and the end of the resonating arm 60A on the +Y-axis side are connected to each other. The end of the resonating arm 60A on the −Y-axis side and the end of the resonating arm 70A on the −X-axis side are connected to each other. The end of the resonating arm 70A on the +X-axis side and the end of the resonating arm 80A on the −Y-axis side are connected to each other. The end of the resonating arm 80A on the +Y-axis side and the end of the resonating arm 50A on the +X-axis side are connected to each other.

In addition, the end of the resonating arm 50B on the −X-axis side and the end of the resonating arm 80A on the +Y-axis side are connected to each other. The end of the resonating arm 50B on the +X-axis side and the end of the resonating arm 60B on the +Y-axis side are connected to each other. The end of the resonating arm 60B on the −Y-axis side and the end of the resonating arm 70B on the +X-axis side are connected to each other. The end of the resonating arm 70B on the −X-axis side and the end of the resonating arm 80A on the −Y-axis side are connected to each other.

The connecting portion 90E connects the basal portion 40A and a portion in which the end of the resonating arm 50A on the −X-axis side and the end of the resonating arm 60A on the +Y-axis side are connected to each other. The connecting portion 90F connects the basal portion 40A and a portion in which the end of the resonating arm 60A on the −Y-axis side and the end of the resonating arm 70A on the −X-axis side are connected to each other. The connecting portion 90G connects the basal portion 40A and a portion in which the end of the resonating arm 70A on the +X-axis side and the end of the resonating arm 80A on the −Y-axis side are connected to each other. The connecting portion 90H connects the basal portion 40A and a portion in which the end of the resonating arm 80A on the +Y-axis side and the end of the resonating arm 50A on the +X-axis side are connected to each other.

The connecting portion 90I connects the basal portion 40B and a portion in which the end of the resonating arm 50B on the −X-axis side and the end of the resonating arm 80A on the +Y-axis side are connected to each other. The connecting portion 90J connects the basal portion 40B and a portion in which the end of the resonating arm 70B on the −X-axis side and the end of the resonating arm 80A on the −Y-axis side are connected to each other. The connecting portion 90K connects the basal portion 40B and a portion in which the end of the resonating arm 60B on the −Y-axis side and the end of the resonating arm 70B on the +X-axis side are connected to each other. The connecting portion 90L connects the basal portion 40B and a portion in which the end of the resonating arm 50B on the +X-axis side and the end of the resonating arm 60B on the +Y-axis side are connected to each other.

In addition, in the resonator 1E, an electrode 30B is provided on the −X-axis side of the resonating arm 60A, an electrode 30C is provided on the +Y-axis side of the resonating arm 50B, and an electrode 30D is provided on the −Y-axis side of the resonating arm 70B.

In such a resonator 1E, as shown in FIG. 17B, when the same alternating voltage is applied to each of the electrodes 30B, 30C, and 30D, according to the same principle as the above-mentioned embodiment, the resonating arms 60A, 50B, and 70B are flexurally deformed toward the outside, and the resonating arm 80A is flexurally deformed toward the +X-axis side. In this case, the resonating arms 50A, 70A, and 60B are flexurally deformed to the inside.

From the above state, the resonating arms 60A, 50B, and 70B are flexurally deformed toward the inside, and the resonating arm 80A is flexurally deformed toward the −X-axis side. In this case, the resonating arms 50A, 70A, and 60B are flexurally deformed to the outside.

In the resonator 1E, each of the resonating arms 50A, 60A, 70A, 80A, 50B, 60B, and 70B repeats a flexural deformation as mentioned above, and performs a flexural vibration.

According to such a resonator 1E, since the number of electrodes is larger than in each of the embodiments, it is possible to achieve an improvement in electric field effi-ciency between the resonation element 2 and each of the electrodes 30B, 30C, and 30D, and to obtain the resonator 1E having a higher Q value.

In addition, the resonation element is supported against the package 9 at two points. Therefore, even when an external force is applied involuntarily to the resonator 1E, it is possible to further effectively prevent the resonation element 2 from being separated from the base 91 of the package 9. Thus, the resonator 1E has more excellent impact resistance.

Seventh Embodiment

Next, a seventh embodiment of the resonator according to the invention will be described.

Figure 18:
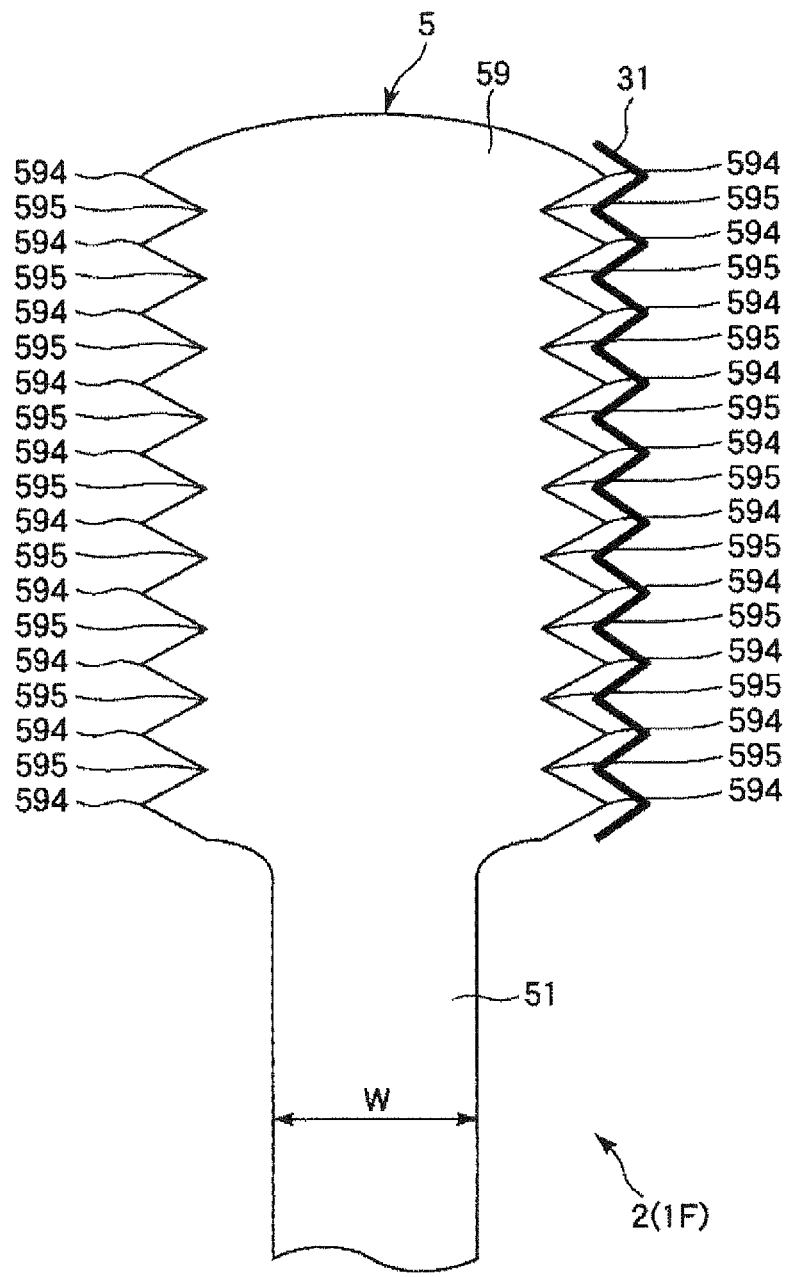
FIG. 18 is a top view of a resonator according to a seventh embodiment of the invention.

FIG. 18 is a top view of a resonator according to the seventh embodiment of the invention.

Hereinafter, the resonator of the seventh embodiment will be described with a focus on differences from the aforementioned first embodiment, and common particulars will not be described below.

The resonator according to the seventh embodiment of the invention is the same as that in the aforementioned first embodiment, except that the configurations of the weight portions are different from each other.

As shown in FIG. 18, in the resonator 1F, the weight portion 59 (the same is true of the weight portion 69) is formed in a sawtooth wave shape in which wide-width portions 594 having a wide width and narrow-width portions 595 having a width narrower than that of the wide-width portion 594 are alternately disposed along the longitudinal direction of the resonating arm 5.

Meanwhile, in the resonator 1F, the width W of the resonating arms 5 and 6 becomes equal to the width of the arm 51, but when the weight portion 59 is omitted, the above width may be set to the width of the wide-width portion 594, may be set to the width of the narrow-width portion 595, and may be set to the average value of the width of the wide-width portion 594 and the width of the narrow-width portion 595.

In such a resonator 1F, a facing area between the weight portion 59 and the electrode 31 increases and a facing area between the weight portion 69 and the electrode 32 increases, to an extent that the weight portions 59 and 69 are formed in a sawtooth wave shape. Therefore, it is possible to achieve an improvement in electric field efficiency between the resonating arms 5 and 6 and the electrodes 31 and 32. Therefore, an area in which an electrostatic force acts on the resonation element 2 increases. Thereby, in the resonator 1F, an equivalent series resistance value becomes smaller, and a Q value becomes larger.

Meanwhile, in the present embodiment, the top of the wide-width portion 594 is formed in an acute shape, but may be rounded.

2. Oscillator

Next, an oscillator (oscillator according to the invention) to which the resonation element according to the invention is applied will be described.

Figure 19:
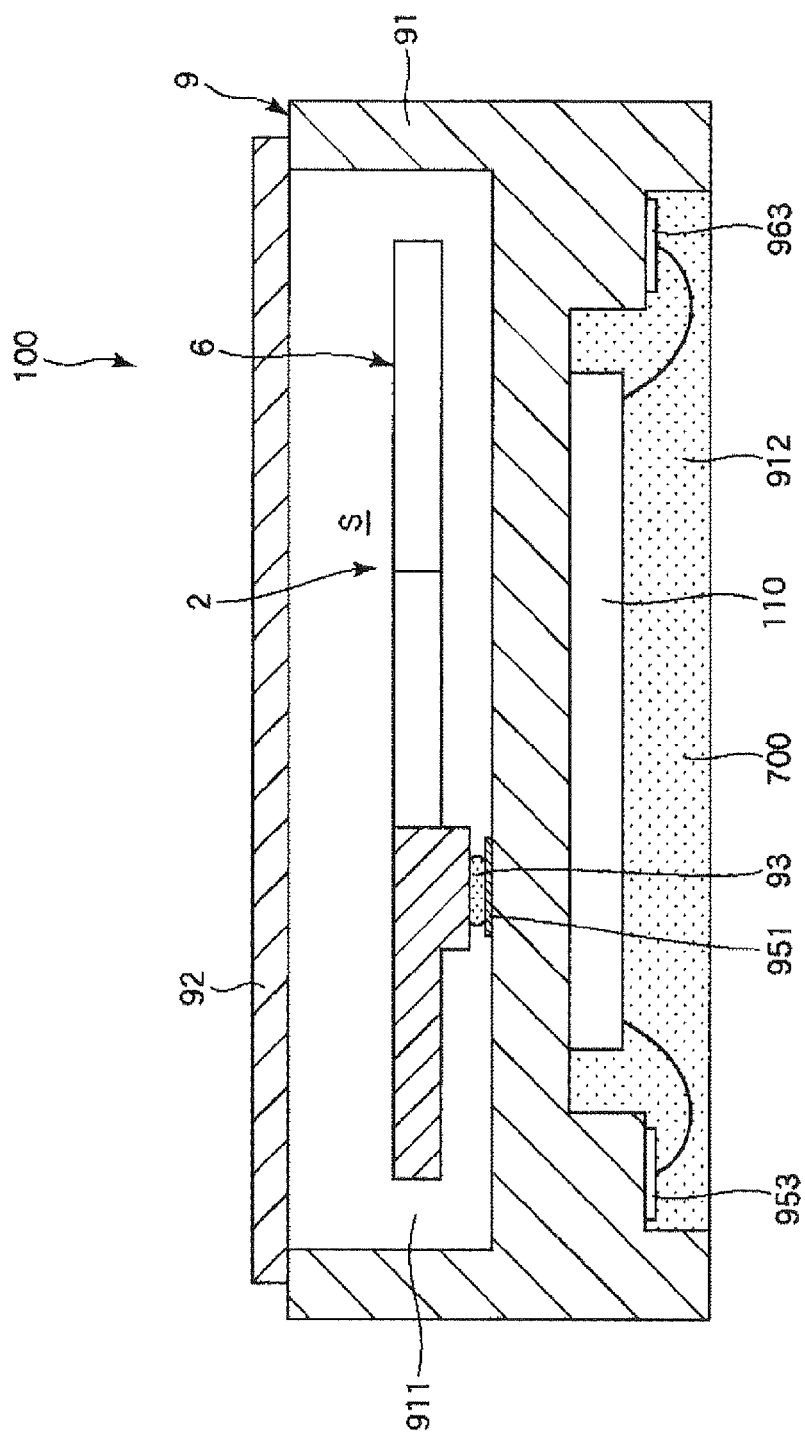
FIG. 19 is a cross-sectional view illustrating a preferred embodiment of an oscillator of the invention.

FIG. 19 is a cross-sectional view illustrating a preferred embodiment of the oscillator according to the invention.

An oscillator 100 shown in FIG. 19 includes the resonator 1, and an IC chip 110 for driving the resonation element 2. Hereinafter, the oscillator 100 will be described with focus on a difference from the aforementioned resonator, and common particulars will not be described below.

As shown in FIG. 19, the base 91 includes a concave portion 911 which is open to the upper surface, and a concave portion 912 which is open to the lower surface.

The resonation element 2 is housed in the concave portion 911. On the other hand, the IC chip 110 is housed in the concave portion 912. The IC chip 110 is fixed to the base 91 through an adhesive. In addition, at least two external terminals 953 and 963 are formed within the concave portion 912. The external terminal 953 is electrically connected to the IC chip 110 by a bonding wire, and is electrically connected to the internal terminal 951 through a through-electrode or an interlayer wiring which is not shown. Similarly, the external terminal 963 is electrically connected to the IC chip 110 by a bonding wire, and is electrically connected to the internal terminals 961 and 962 through a through-electrode or an interlayer wiring which is not shown. In addition, a resin material 700 is filled into the concave portion 912, and IC chip 110 is sealed with this resin material 700.

The IC chip 110 includes an oscillation circuit (drive circuit) for controlling drive of the resonation element 2. When the resonation element 2 is driven by the IC chip 110, a signal having a predetermined frequency can be extracted.

Meanwhile, in FIG. 19, a configuration in which the IC chip 110 is disposed in the concave portion 912 which is open to the lower surface has been described, but the arrangement of the IC chip 110 is not particularly limited, and the IC chip may be disposed in, for example, the concave portion 911 which is open to the upper surface.

3. Electronic Device

Next, an electronic device (electronic device according to the invention) to which the resonation element according to the invention is applied will be described.

Figure 20:
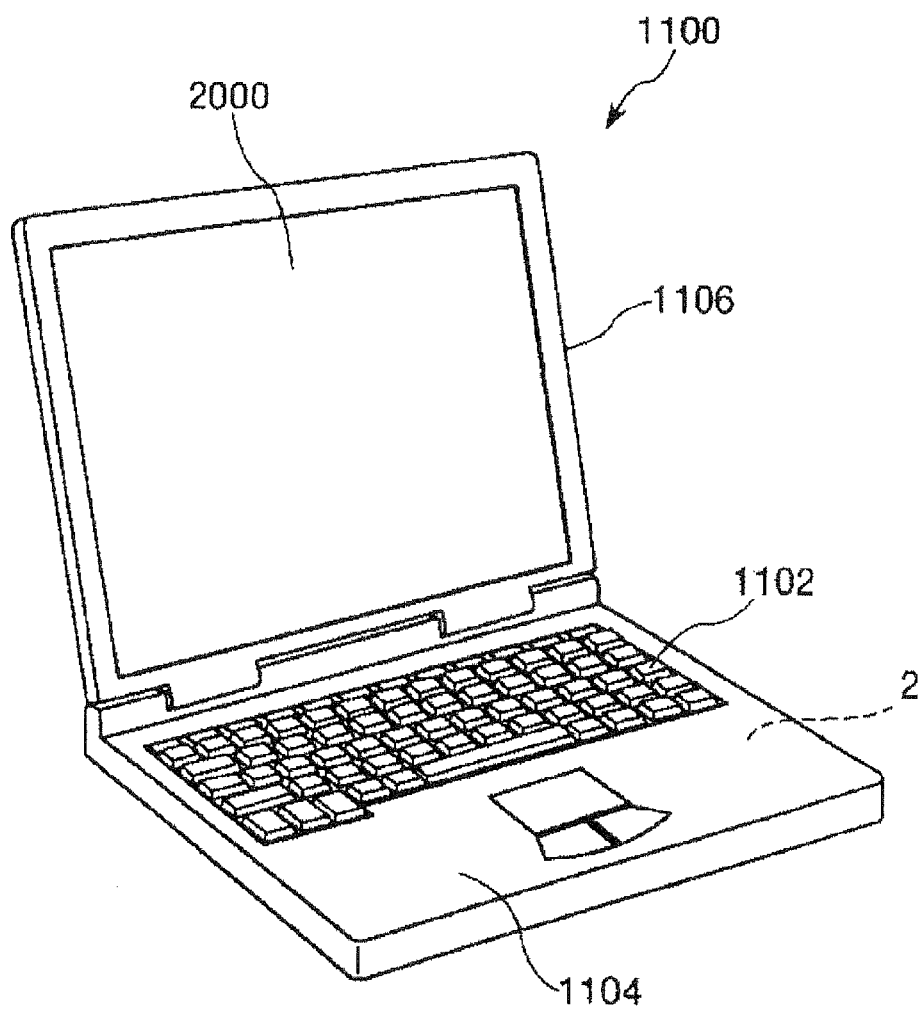
FIG. 20 is a perspective view illustrating a configuration of a mobile type (or note type) personal computer to which an electronic device including the resonation element of the invention is applied.

FIG. 20 is a perspective view illustrating a configuration of a mobile type (or note type) personal computer to which an electronic device including the resonation element according to the invention is applied. In this drawing, a personal computer 1100 is constituted by a main body 1104 including a keyboard 1102 and a display unit 1106 including a display portion 2000, and the display unit 1106 is rotatably supported with respect to the main body 1104 through a hinge structure. Such a personal computer 1100 has the built-in resonation element 2 functioning as a filter, a resonator, a reference clock, or the like.

Figure 21:
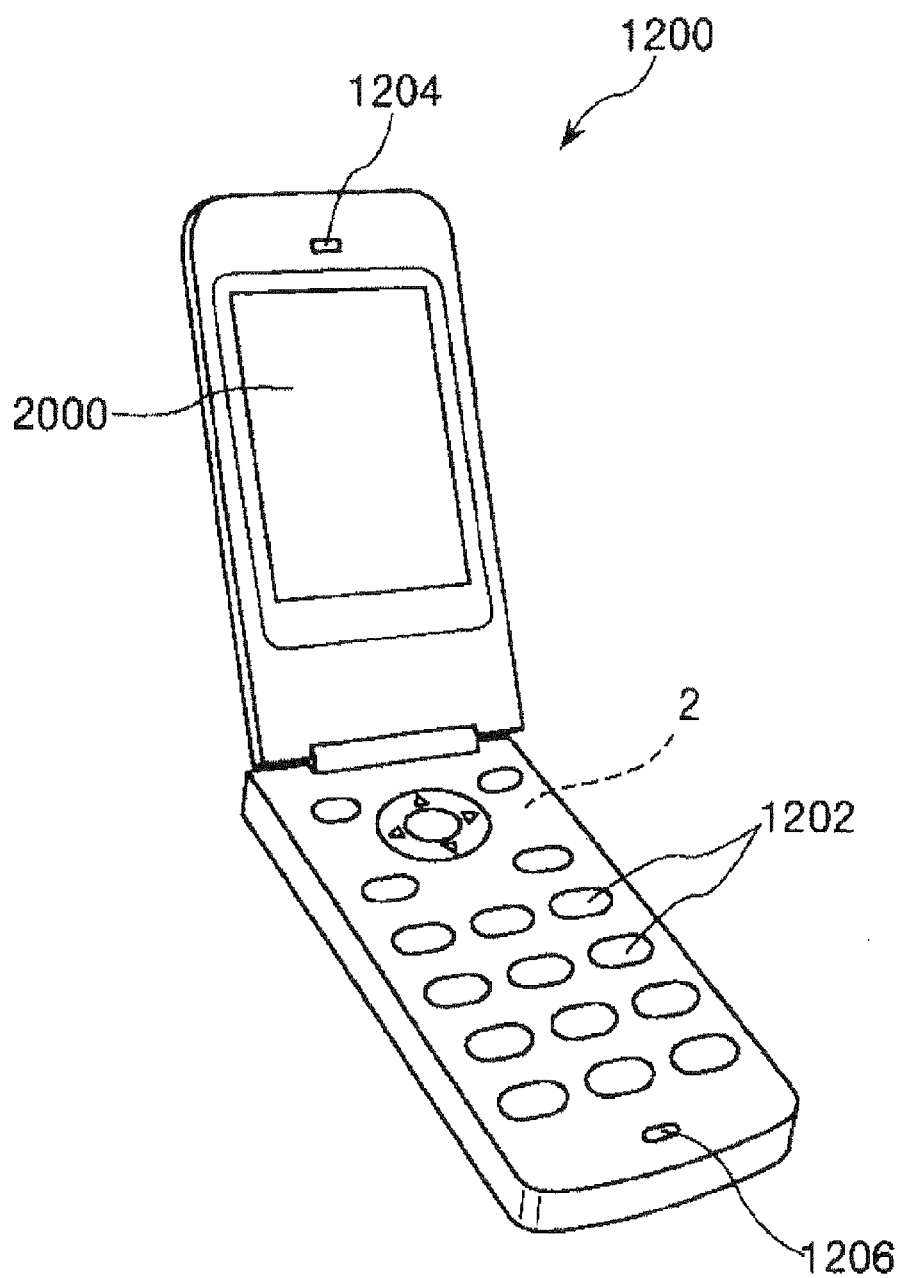
FIG. 21 is a perspective view illustrating a configuration of a cellular phone (also including PHS) to which an electronic device including the resonation element of the invention is applied.

FIG. 21 is a perspective view illustrating a configuration of a cellular phone (also including PHS) to which an electronic device including the resonation element according to the invention is applied. In this drawing, a cellular phone 1200 includes a plurality of operation buttons 1202, an ear piece 1204 and a mouth piece 1206, and a display portion 2000 is disposed between the operation buttons 1202 and the ear piece 1204. Such a cellular phone 1200 has the built-in resonation element 2 functioning as a filter, a resonator, or the like.

Figure 22:
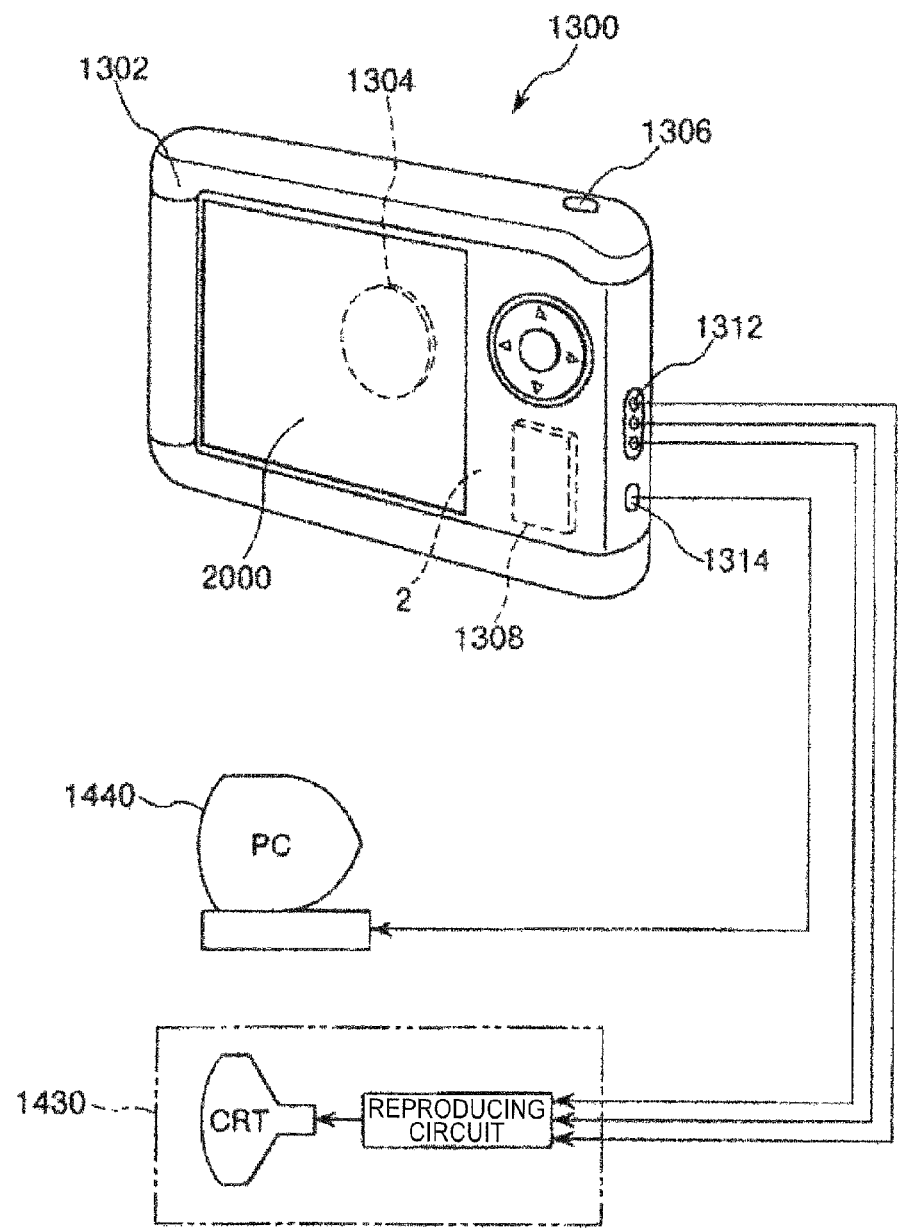
FIG. 22 is a perspective view illustrating a configuration of a digital still camera to which an electronic device including the resonation element of the invention is applied.

FIG. 22 is a perspective view illustrating a configuration of a digital still camera to which an electronic device including the resonation element according to the invention is applied. Meanwhile, in the drawing, the connection with an external device is also shown simply. Here, a normal camera exposes a silver halide photo film through a light image of a subject, whereas a digital still camera 1300 generates an imaging signal (image signal) by photoelectrically converting a light image of a subject using an imaging device such as a CCD (Charge Coupled Device).

A display portion is provided on the rear of a case (body) 1302 in the digital still camera 1300, and is configured to perform a display on the basis of an imaging signal of a CCD. The display portion functions as a viewfinder for displaying a subject as an electronic image. In addition, a light-receiving unit 1304 including an optical lens (imaging optical system), a CCD and the like is provided on the front side (back side in the drawing) of the case 1302.

When a photographer confirms a subject image displayed on the display portion and pushes a shutter button 1306, an imaging signal of the CCD at that point in time is transmitted and stored to and in a memory 1308. In addition, in the digital still camera 1300, a video signal output terminal 1312 and an input and output terminal 1314 for data communication are provided on the lateral side of the case 1302. As shown in the drawing, a TV monitor 1430 is connected to the video signal output terminal 1312 and a personal computer 1440 is connected to the input and output terminal 1314 for data communication, respectively as necessary. Further, the imaging signal stored in the memory 1308 is output to the TV monitor 1430 or the personal computer 1440 by a predetermined operation. Such a digital still camera 1300 has the built-in resonation element 2 functioning as a filter, a resonator, or the like.

Meanwhile, in addition to the personal computer (mobile type personal computer) of FIG. 20, the cellular phone of FIG. 21, and the digital still camera of FIG. 22, the electronic device including the resonation element according to the invention can be applied to, for example, an ink jet ejecting apparatus (for example, ink jet printer), a laptop personal computer, a television, a video camera, a video recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a ship), a flight simulator, and the like.

4. Moving Object

Next, a moving object (moving object according to the invention) to which the resonation element according to the invention is applied will be described.

Figure 23:
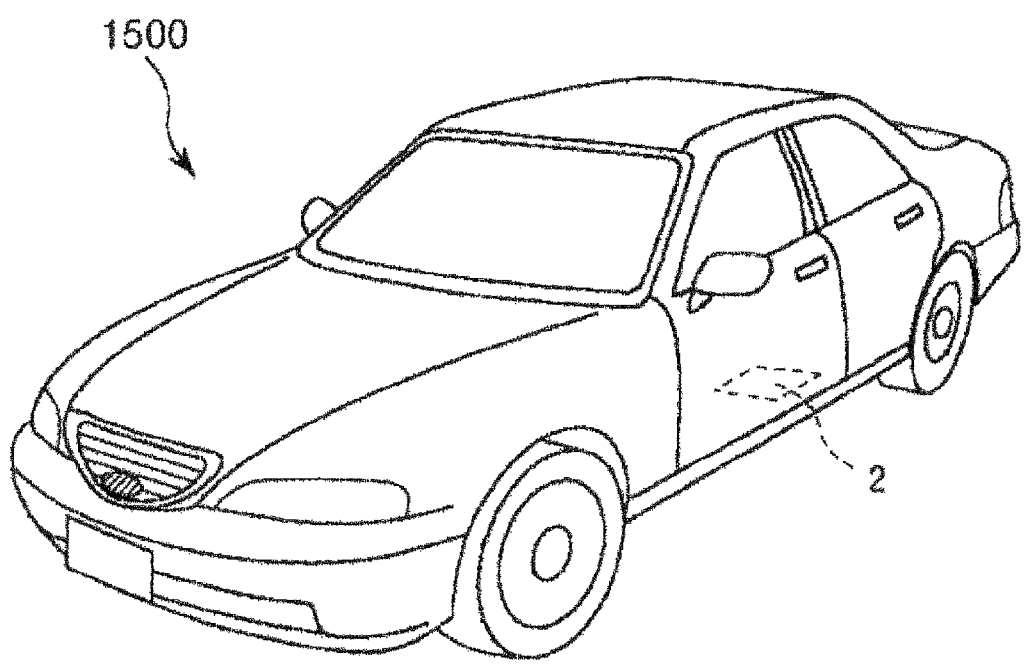
FIG. 23 is a perspective view schematically illustrating an automobile as an example of a moving object of the invention.

FIG. 23 is a perspective view schematically illustrating an automobile as an example of the moving object according to the invention. The resonation element 2 is mounted to an automobile 1500. The resonation element 2 can be applied widely to electronic control units (ECUs) such as a keyless entry, an immobilizer, a car navigation system, a car air conditioner, an antilock brake system (ABS), an air bag, a tire pressure monitoring system (TPMS), an engine controller, a battery monitor of a hybrid automobile or an electric automobile, and a car-body posture control system.

As stated above, the resonation element, the resonator, the oscillator, the electronic device and the moving object according to the invention have been described on the basis of the shown embodiments, but the invention is not limited thereto, and the configuration of each portion can be replaced by any configuration having the same function. In addition, any other configurations may be added to the invention. In addition, the respective embodiments may be appropriately combined.

Meanwhile, in each of the embodiments, the drive region is a region from the tip of the resonating arm to L/2, in the resonation element, but there is no limitation thereto in the invention. The length thereof may be from the tip of the resonating arm to less than L/2, and may be from the tip of the resonating arm to greater than L/2.

The entire disclosure of Japanese Patent Application No. 2014-183733 filed Sep. 9, 2014 is expressly incorporated by reference herein.

What is claimed is:

1. A resonation element comprising:
a basal portion;
at least one resonating arm extending out in a first direction from the basal portion; and
a single crystal silicon substrate in which a length along a second direction perpendicular to the first direction is set to a thickness,
wherein the resonating arm is flexurally vibrated along a third direction perpendicular to the first direction and the second direction,
wherein the resonating arm is flexurally vibrated by an electrostatic force,
wherein the resonating arm includes a region, receiving the electrostatic force, in a region from a tip on an opposite side to the basal portion side toward the basal portion side along the first direction to L/2, when seen in plan view, and
wherein when a resonation frequency of the resonating arm is set to F [kHz], a width along the third direction of the resonating arm is set to W [μm], and a length along the first direction of the resonating arm is set to L [μm],
at least one expression of the following Expression (1) and the following Expression (2) is satisfied, $$W < 10^{A \times Log(F) + B} \quad (1)$$

where, A is $-5.006 \times 10^{-1}$, and B is 2.451, and $$L < 10^{C \times log(F) + D} \quad (2)$$

where, C is $-7.507 \times 10^{-1}$, and D is 4.268.

2. The resonation element according to claim 1, wherein when Expression (1) is satisfied, the following Expression (3) is satisfied, and
wherein when Expression (2) is satisfied, the following Expression (4) is satisfied, $$W < 0.8 \times 10^{A \times log(F) + B} \quad (3)$$

$$L < 0.8 \times 10^{C \times log(F) + D} \quad (4).$$

3. The resonation element according to claim 1, wherein the resonating arm includes a pair of lateral sides having a front-back relationship with each other along the third direction, and
the silicon substrate is exposed in a region of ⅓ which is occupied by the pair of lateral sides in a total length of the resonating arm along the first direction from the basal portion side.

4. The resonation element according to claim 2, wherein the resonating arm includes a pair of lateral sides having a front-back relationship with each other along the third direction, and
the silicon substrate is exposed in a region of ⅓ which is occupied by the pair of lateral sides in a total length of the resonating arm along the first direction from the basal portion side.

5. The resonation element according to claim 1, wherein the resonating arm includes front and back main surfaces in which the second direction is set to a normal direction, and is provided with a groove, extending in the first direction, on at least one of the main surface sides.

6. The resonation element according to claim 2, wherein the resonating arm includes front and back main surfaces in which the second direction is set to a normal direction, and is provided with a groove, extending in the first direction, on at least one of the main surface sides.

7. The resonation element according to claim 1, wherein the resonating arm includes a weight portion and an arm which is provided between the weight portion and the basal portion, when seen in plan view.

8. The resonation element according to claim 2, wherein the resonating arm includes a weight portion and an arm which is provided between the weight portion and the basal portion, when seen in plan view.

9. A resonator comprising:
the resonation element according to claim 1; and
a container that has the resonation element housed therein.

10. A resonator comprising:
the resonation element according to claim 2; and
a container that has the resonation element housed therein.

11. An oscillator comprising:
the resonation element according to claim 1; and
a circuit.

12. An oscillator comprising:
the resonation element according to claim 2; and
a circuit.

13. An electronic device comprising the resonation element according to claim 1.

14. An electronic device comprising the resonation element according to claim 2.

15. A moving object comprising the resonation element according to claim 1.

16. A moving object comprising the resonation element according to claim 2.

17. The resonation element according to claim 1, wherein in the resonating arm, an entire region that receives the electrostatic force is arranged in a region from a tip, at a side opposite to the basal portion side, toward the basal portion side along the first direction to L/2, when seen in plan view.

* * * * *